United States Patent
Song

(10) Patent No.: US 11,107,882 B2
(45) Date of Patent: Aug. 31, 2021

(54) INTEGRATED CIRCUIT DEVICE INCLUDING COMPLEMENTARY METAL-OXIDE-SEMICONDUCTOR TRANSISTOR WITH FIELD CUT REGIONS TO INCREASE CARRIER MOBILITY

(71) Applicant: Samsung Electronics Co., Ltd., Suwon-si (KR)

(72) Inventor: Jae-joon Song, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/453,228

(22) Filed: Jun. 26, 2019

(65) Prior Publication Data
US 2020/0168700 A1    May 28, 2020

(30) Foreign Application Priority Data
Nov. 27, 2018 (KR) .......................... 10-2018-0148767

(51) Int. Cl.
- *H01L 27/02* (2006.01)
- *H01L 21/8238* (2006.01)
- *H01L 29/06* (2006.01)
- *H01L 27/092* (2006.01)

(52) U.S. Cl.
CPC ...... *H01L 29/0642* (2013.01); *H01L 27/0928* (2013.01)

(58) Field of Classification Search
CPC  H01L 21/8238–823892; H01L 27/0203–0296
See application file for complete search history.

(56) References Cited

U.S. PATENT DOCUMENTS

| | | | |
|---|---|---|---|
| 5,608,253 A * | 3/1997 | Liu | H01L 29/6659 257/365 |
| 5,677,867 A * | 10/1997 | Hazani | G11C 11/5621 257/E21.682 |
| 6,690,067 B2 | 2/2004 | Ker et al. | |
| 7,098,520 B2 | 8/2006 | Park et al. | |
| 8,217,469 B2 * | 7/2012 | Hou | H01L 29/4238 257/401 |
| 10,916,542 B2 * | 2/2021 | Chen | H01L 29/42364 |
| 2009/0207539 A1 | 8/2009 | Suzuki | |

(Continued)

FOREIGN PATENT DOCUMENTS

| | | |
|---|---|---|
| JP | 2011-029430 | 2/2011 |
| JP | 4823098 | 9/2011 |

(Continued)

*Primary Examiner* — Allen L Parker
*Assistant Examiner* — Gustavo G Ramallo
(74) *Attorney, Agent, or Firm* — Myers Bigel, P.A.

(57) ABSTRACT

An integrated circuit device includes a substrate including a first conductivity type region and a second conductivity type region, a first active region arranged in the second conductivity type region, a second active region arranged in the first conductivity type region and spaced apart from the first active region with an isolation region between the second active region and the first active region, an isolation film formed in the isolation region, and a first field cut region extending along the isolation region in a first direction parallel with a channel length direction of each of a first conductivity type transistor on the first active region and a second conductivity type transistor on the second active region.

20 Claims, 16 Drawing Sheets

(56) References Cited

U.S. PATENT DOCUMENTS

| | | | |
|---|---|---|---|
| 2011/0156169 A1 | 6/2011 | Choi et al. | |
| 2012/0217612 A1* | 8/2012 | Baars | H01L 29/7841 257/508 |
| 2017/0092641 A1 | 3/2017 | Kim | |
| 2018/0138204 A1* | 5/2018 | Tsuboi | H03K 17/687 |
| 2020/0066837 A1* | 2/2020 | Karp | H01L 29/78 |

FOREIGN PATENT DOCUMENTS

| | | |
|---|---|---|
| KR | 10-2007-0022522 | 2/2007 |
| KR | 10-2013-0142420 | 12/2013 |

\* cited by examiner

INTEGRATED CIRCUIT DEVICE INCLUDING COMPLEMENTARY METAL-OXIDE-SEMICONDUCTOR TRANSISTOR WITH FIELD CUT REGIONS TO INCREASE CARRIER MOBILITY

CROSS-REFERENCE TO RELATED APPLICATION

This application claims the benefit of Korean Patent Application No. 10-2018-0148767, filed on Nov. 27, 2018, in the Korean Intellectual Property Office, the disclosure of which is incorporated herein in its entirety by reference.

FIELD

The inventive concepts relate to integrated circuit devices, and more particularly, to integrated circuit devices including complementary metal-oxide-semiconductor (CMOS) transistors.

BACKGROUND

With development of the electronics industry, integrated circuit devices have become more compact and have increasing integration density and performance, and operating speed requirements for in integrated circuit devices may be increasing. Circuit designs and arrangements for increasing operating speed may be improved by suppressing increases in parasitic capacitance and/or increasing the performance of transistors in circuits that make up the integrated circuit devices.

SUMMARY

The inventive concepts provide an integrated circuit device for increasing an operating speed by increasing the performance of a transistor.

According to an aspect of the inventive concepts, there is provided an integrated circuit device including a substrate including a first conductivity type region and a second conductivity type region, at least one first active region arranged in the second conductivity type region, at least one second active region arranged in the first conductivity type region, the at least one second active region being spaced apart from the at least one first active region with an isolation region between the at least one second active region and the at least one first active region, an isolation film formed in the isolation region, at least one first conductivity type transistor formed on the at least one first active region, at least one second conductivity type transistor formed on the at least one second active region, and a first field cut region extending long in the isolation region in a first direction parallel with a channel length direction of each of the at least one first conductivity type transistor and the at least one second conductivity type transistor.

According to another aspect of the inventive concepts, there is provided an integrated circuit device including a substrate including an n-type region and a p-type region, a first active region arranged in the n-type region, a second active region arranged in the p-type region, the second active region being spaced apart from the first active region in a first direction with an isolation region between the second active region and the first active region, an isolation film formed in the isolation region, and a field cut region arranged in the n-type region in the isolation region and extending long in a second direction perpendicular to the first direction.

According to a further aspect of the inventive concepts, there is provided an integrated circuit device including a substrate including an n-type region and a p-type region, a plurality of first active regions arranged in the n-type region, a plurality of second active regions arranged in the p-type region, the plurality of second active regions being spaced apart from the plurality of first active regions in a first direction with an isolation region between the plurality of second active regions and the plurality of first active regions, an isolation film formed in the isolation region, and a field cut region including a portion of the substrate and extending long across the isolation film in a second direction perpendicular to the first direction in the isolation region.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

The term "metal-oxide-semiconductor (MOS)" used herein is widely used in the art to which embodiments pertain. "M" is not limited to metals but may include various kinds of conductors and "S" may include a substrate or semiconductor structure. In addition, "O" is not limited to oxides but may include various kinds of inorganic or organic materials. The term "semiconductor" may include monocrystalline semiconductor, polycrystalline semiconductor, amorphous semiconductor, Group IV semiconductor, or compound semiconductor. A conductivity type or doped region of elements may be defined as "p-type" or "n-type" according to the characteristics of a main carrier. A more general term "first conductivity type" or "second conductivity type" may be used for "p-type" or "n-type," or vice versa. Here, the first conductivity type may be p-type or n-type and the second conductivity type may be n-type or p-type. More generally, the terms first, second, third, etc. are used herein merely to distinguish or differentiate one element from another.

Figure 1A:
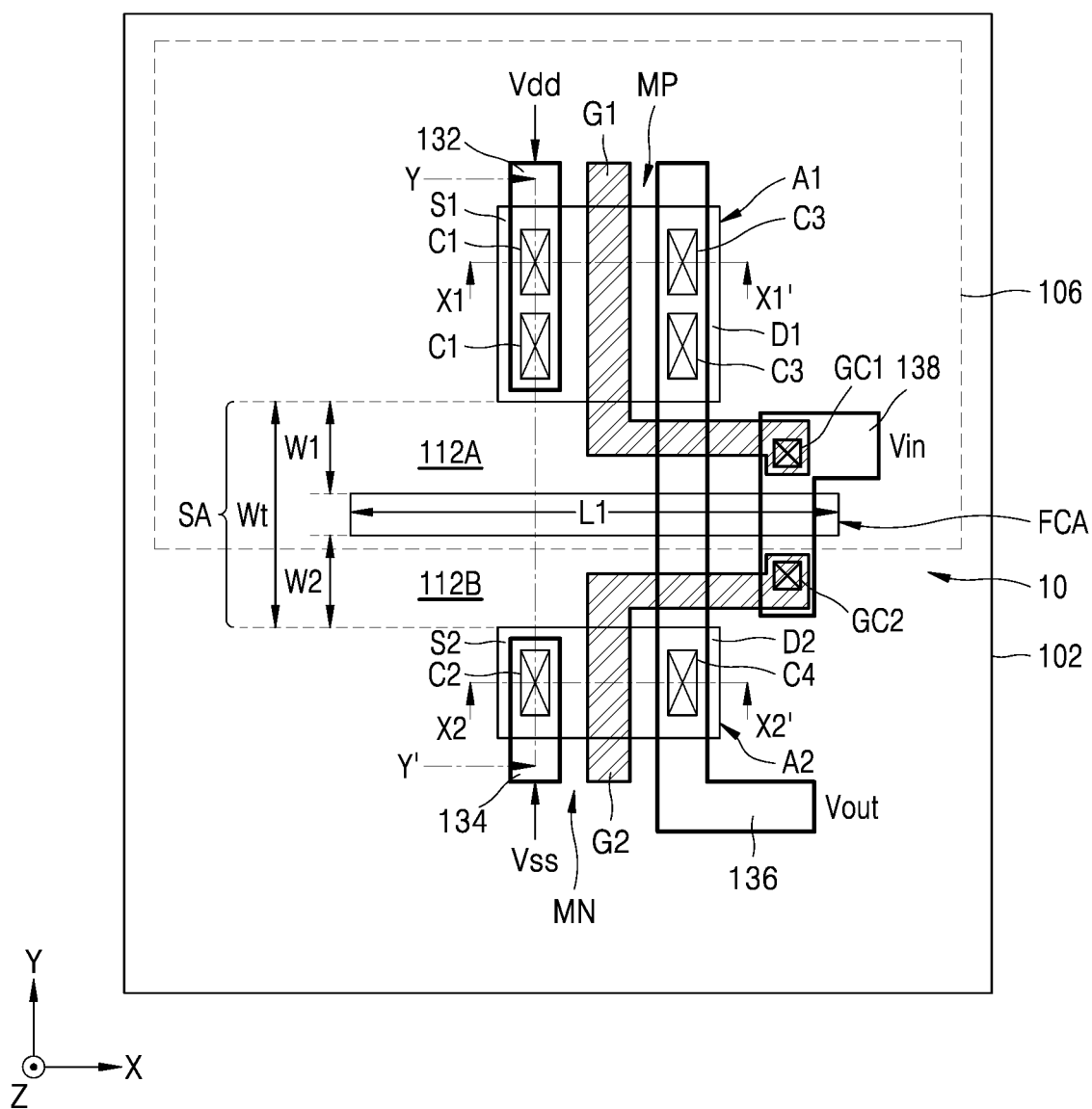
FIG. 1A is a plan view layout of some elements of an integrated circuit device, according to embodiments of the inventive concepts.
Figure 1B:
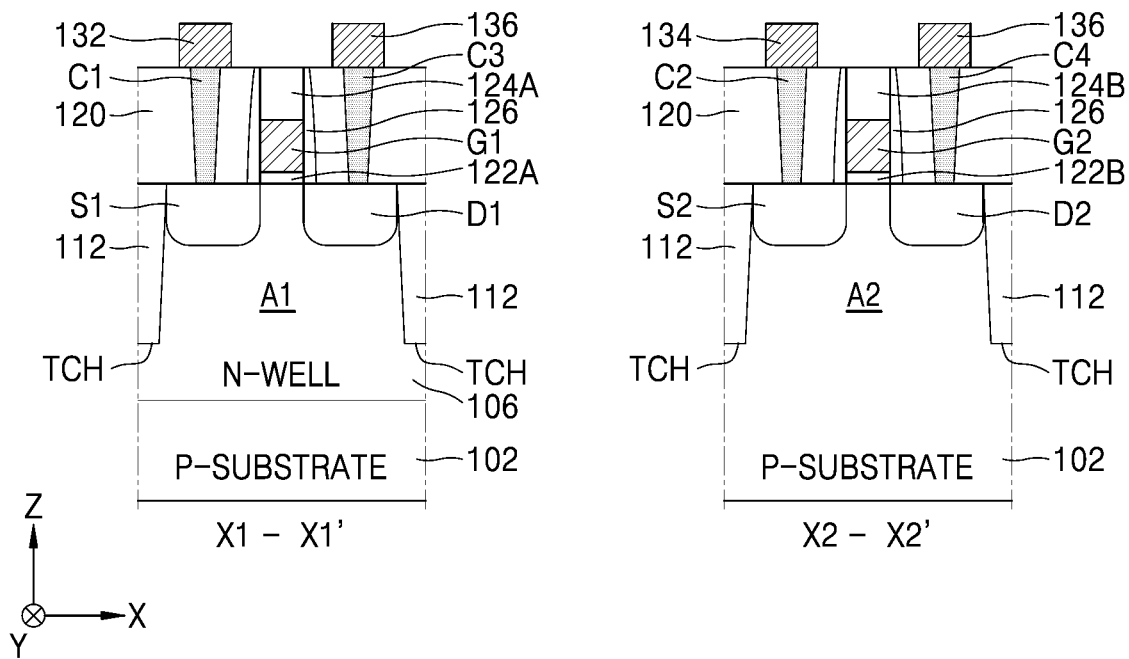
FIG. 1B shows cross-sectional views respectively taken along line X1-X1' and line X2-X2' in FIG. 1A.
Figure 1C:
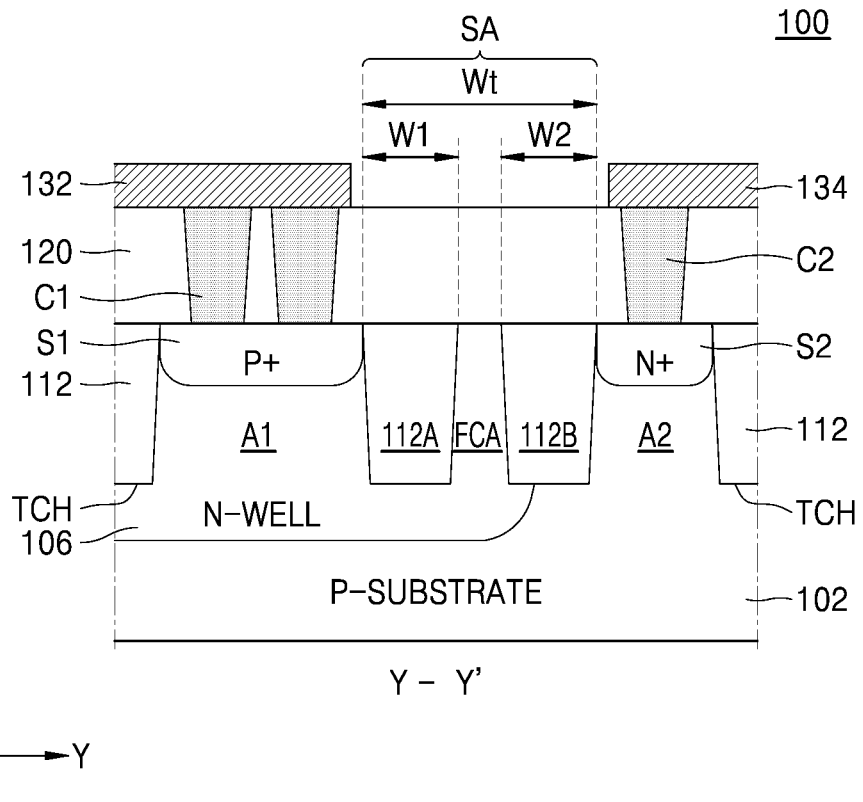
FIG. 1C is a cross-sectional view taken along line Y-Y' in FIG. 1A.

FIG. 1A is a plan view layout of some elements of an integrated circuit device, according to embodiments of the inventive concepts. FIG. 1B shows cross-sectional views respectively taken along line X1-X1' and line X2-X2' in FIG. 1A. FIG. 1C is a cross-sectional view taken along line Y-Y' in FIG. 1A.

Referring to FIGS. 1A through 1C, an integrated circuit device 100 includes a substrate 102, which includes a first conductivity type region and a second conductivity type region. In some embodiments, a first conductivity type may be p-type and a second conductivity type may be n-type. In some embodiments, the first conductivity type region may be a p-type well, which is formed by doping a portion of the substrate 102 with a p-type dopant. In some embodiments, the first conductivity type region may be a p-substrate, e.g., the substrate 102, itself. The second conductivity type region may be an n-well, which is formed by doping a p-type well or a portion of the p-substrate, i.e., the substrate 102, with an n-type dopant. Hereinafter, for convenience of description, it is assumed that the first conductivity type is p-type, the second conductivity type is n-type, the first conductivity type region is a portion of a p-substrate, i.e., the substrate 102, and the second conductivity type region is an n-well 106 formed in another portion of the p-substrate, i.e., the substrate 102.

A trench TCH defining a plurality of active regions may be formed in the substrate 102 of the integrated circuit device 100 and may be filled with an isolation film 112. The active regions may include a first active region A1 and a second active region A2, which are spaced apart from each other with an isolation region SA therebetween. A P-channel MOS (PMOS) transistor MP may be formed on the first active region A1 and an N-channel MOS (NMOS) transistor MN may be formed on the second active region A2.

The substrate 102 may include a field cut region FCA in the isolation region SA. The field cut region FCA extends along a direction, e.g., an X-direction, parallel with a channel length direction of each of the PMOS transistor MP and the NMOS transistor MN. The field cut region FCA may be formed in the n-well 106. However, the inventive concepts are not limited thereto. For example, the field cut region FCA may be formed in a portion of the p-substrate, i.e., the substrate 102. In some embodiments, the field cut region FCA may be a portion of the substrate 102 that is free of transistors therein, in contrast to the first active region A1 and the second active region A2.

The first active region A1 may be defined in a portion of the n-well 106. The PMOS transistor MP may include a first gate G1 formed on or above the first active region A1, and a first source S1 and a first drain D1, which are respectively formed at opposite sides of the first gate G1 in the first active region A1. Each of the first source S1 and the first drain D1 may include a p+-type doped region. The second active region A2 may be defined in a portion of the p-substrate, i.e., the substrate 102. The NMOS transistor MN may include a second gate G2 formed on or above the second active region A2, and a second source S2 and a second drain D2, which are respectively formed at opposite sides of the second gate G2 in the second active region A2. Each of the second source S2 and the second drain D2 may include an n+-type doped region. In some embodiments, the PMOS transistor MP and the NMOS transistor MN may form an inverter 10.

Figure 2:
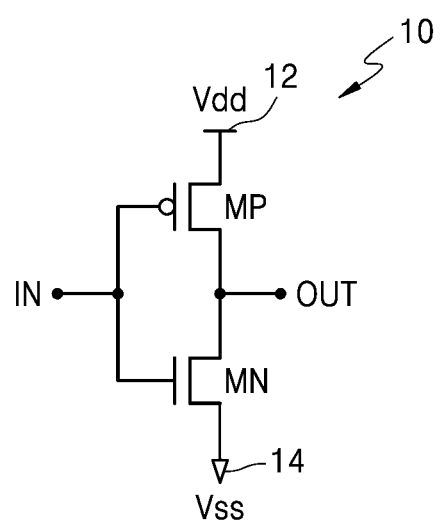
FIG. 2 is a circuit diagram of an inverter in FIG. 1A.

FIG. 2 is an example circuit diagram of the inverter 10 in FIG. 1A. Referring to FIGS. 1A through 1C and FIG. 2, the PMOS transistor MP and the NMOS transistor MN may be connected between a power supply terminal 12 and a ground terminal 14 in the inverter 10. The PMOS transistor MP may be connected between the power supply terminal 12 receiving a supply voltage Vdd and an output terminal OUT. The NMOS transistor MN may be connected between the ground terminal 14 receiving a ground voltage Vss and the output terminal OUT.

The first gate G1 of the PMOS transistor MP and the second gate G2 of the NMOS transistor MN may be connected in common to an input terminal IN receiving an input signal Vin. The first source S1 of the PMOS transistor MP may be connected to the power supply terminal 12 and the second source S2 of the NMOS transistor MN may be connected to the ground terminal 14. The first drain D1 of the PMOS transistor MP may be connected to the output terminal OUT outputting an output signal Vout and to the second drain D2 of the NMOS transistor MN.

In some embodiments, the substrate 102 may include Si, Ge, SiGe, SiC, SiSn, PbS, GaAs, InP, GaP, GaN, or ZnSe. The isolation film 112 may include an insulating film including an oxide film, a nitride film, or a combination thereof.

The field cut region FCA may have a bar shape, which linearly extends along a direction, e.g., the X-direction, parallel with the channel length direction of each of the PMOS transistor MP and the NMOS transistor MN in the isolation region SA between the first active region A1 and the second active region A2. The field cut region FCA may extend penetrating through the isolation region SA in the X-direction. A length L1 of the field cut region FCA in the X-direction may be equal to or greater than an X-direction length of each of the first active region A1 and the second active region A2. The first active region A1 and the second active region A2 may face each other with the field cut region FCA therebetween.

The field cut region FCA may extend along the X-direction, crossing and dividing the isolation film 112 in the isolation region SA. The isolation film 112 may include a first isolating portion 112A, which is arranged between the first active region A1 and the field cut region FCA and borders or defines respective boundaries of the first active region A1 and the field cut region FCA, and a second isolating portion 112B, which is arranged between the second active region A2 and the field cut region FCA and borders or defines respective boundaries of the second active region A2 and the field cut region FCA. The first isolating portion 112A and the second isolating portion 112B may extend in the X-direction to be parallel with the field cut region FCA.

A first gate insulating film 122A may be between the first active region A1 and the first gate G1. A top surface of the first gate G1 may be covered with a first capping layer 124A. A second gate insulating film 122B may be between the second active region A2 and the second gate G2. A top surface of the second gate G2 may be covered with a second capping layer 124B.

Each of the first gate G1 and the second gate G2 may include conductive polysilicon, metal, conductive metal nitride, or a combination thereof. The metal may include Ti, Ta, W, Mo, Au, Cu, Al, Ni, Co, Ru, Nb, La, Mg, Sr, and/or Hf. The metal nitride may include TiN, TaN, or a combination thereof. Each of the first gate insulating film 122A and the second gate insulating film 122B may include a silicon oxide film, a silicon nitride film, a silicon oxynitride film, a high-k dielectric film, or a combination thereof. The high-k dielectric film may include metal oxide which has a higher dielectric constant than a silicon oxide film. For example, the high-k dielectric film may include hafnium oxide, hafnium oxynitride, or hafnium silicon oxide but is not limited to these example materials.

A side wall of each of the first gate insulating film 122A, the first gate G1, the first capping layer 124A, the second gate insulating film 122B, the second gate G2, and the second capping layer 124B may be covered with an insulating spacer 126. Each of the first capping layer 124A, the second capping layer 124B, and the insulating spacer 126 may include a silicon nitride film, a silicon oxide film, or a combination thereof.

An intergate insulating film 120 may be formed around the first gate G1 and the second gate G2 on the substrate 102 to cover the first source S1, the first drain D1, the second source S2, and the second drain D2. A plurality of contacts penetrating the intergate insulating film 120 may be formed on the substrate 102. A plurality of wirings may be formed on the intergate insulating film 120 and the plurality of contacts. The intergate insulating film 120 may include an oxide film, a nitride film, or a combination thereof. The plurality of contacts may include a first contact C1, a second contact C2, a third contact, C3, and a fourth contact C4. The plurality of wirings may include a first wiring 132, a second wiring 134, a third wiring 136, and a fourth wiring 138. The plurality of contacts and the plurality of wirings may include Cu, W, WN, Ta, Ti, TaN, TiN, Co, Mn, Al, AN, or a combination thereof.

The first source S1 may receive the supply voltage Vdd via the first wiring 132 and the first contact C1. The second source S2 may receive the ground voltage Vss via the second wiring 134 and the second contact C2. The first drain D1 may be connected to the output terminal OUT via the third wiring 136 and the third contact C3. The second drain D2 may be connected to the output terminal OUT via the third wiring 136 and the fourth contact C4. The number of contacts connected to each of the first source S1, the second source S2, the first drain D1, and the second drain D2 is not limited to the one shown in FIGS. 1A through 1C and may be variously changed according to necessity.

The first gate G1 may receive a voltage or a signal via a first gate contact GC1 formed on the first gate G1. The second gate G2 may receive a voltage or a signal via a second gate contact GC2 formed on the second gate G2. The first gate contact GC1 and the second gate contact GC2 may be connected to the fourth wiring 138. The first gate G1 and the second gate G2 may be electrically connected to each other via the first gate contact GC1, the second gate contact GC2, and the fourth wiring 138.

The field cut region FCA may increase a carrier mobility of the PMOS transistor MP and the NMOS transistor MN by providing tensile stress to a channel region of each of the PMOS transistor MP and the NMOS transistor MN in a width direction, e.g., a Y-direction, of each of the first gate G1 and the second gate G2. The first active region A1 is spaced apart from the second active region A2 in the Y-direction with the isolation region SA having an isolation width Wt therebetween. The first isolating portion 112A is spaced apart from the second isolating portion 112B in the Y-direction with the field cut region FCA therebetween in the isolation region SA. A Y-direction width W1 of the first isolating portion 112A and a Y-direction width W2 of the second isolating portion 112B are less than the isolation width Wt of the isolation region SA in the Y-direction.

The inventive concepts may arise from determination (e.g., from repeated experiments) that when a Y-direction width of the isolation film 112 between the PMOS transistor MP and the NMOS transistor MN decreases, tensile stress applied in the Y-direction to the channel of each of the PMOS transistor MP and the NMOS transistor MN increases so that an energy band structure of the channel region may be changed. In particular, when the crystal orientation of the PMOS transistor MP and the NMOS transistor MN, which are formed on a silicon substrate, in a channel length direction is <110> and the Y-direction width of the isolation film 112 between the first active region A1 and the second active region A2 decreases, tensile stress applied in a direction perpendicular to the channel of each of the PMOS transistor MP and the NMOS transistor MN increases, and accordingly, a carrier mobility of the PMOS transistor MP and the NMOS transistor MN increases, resulting in an increase in an ON current and a decrease in a propagation delay time.

To improve or optimize the mobility characteristic of the PMOS transistor MP and the NMOS transistor MN, the Y-direction width W1 of the first isolating portion 112A and the Y-direction width W2 of the second isolating portion 112B may be variously determined by controlling a Y-direction position of the field cut region FCA between the first active region A1 and the second active region A2. The Y-direction width W1 of the first isolating portion 112A and the Y-direction width W2 of the second isolating portion 112B may be determined taking into account a type and a size or amount of stress to be applied to each of the first active region A1 and the second active region A2. In some embodiments, the Y-direction width W1 of the first isolating portion 112A may be similar to or substantially the same as the Y-direction width W2 of the second isolating portion 112B. In some embodiments, the Y-direction width W1 of the first isolating portion 112A may be less than the Y-direction width W2 of the second isolating portion 112B. In some embodiments, the Y-direction width W1 of the first isolating portion 112A may be greater than the Y-direction width W2 of the second isolating portion 112B.

In manufacturing the integrated circuit device 100, the field cut region FCA may be simultaneously formed when the trench TCH defining the first active region A1 and the second active region A2 is formed and the first and second isolating portions 112A and 112B filling the trench TCH around the field cut region FCA may be formed when the isolation film 112 is formed. Since the field cut region FCA is arranged in the isolation region SA between the first active region A1 and the second active region A2 in the integrated circuit device 100, the first and second isolating portions 112A and 112B that respectively have the widths W1 and W2, which are much less than a width of the isolation film 112 that may be arranged between the first active region A1 and the second active region A2 when the field cut region FCA is not formed in the isolation region SA, may be arranged in the isolation region SA. That is, the field cut region FCA divides the isolation film 112 into multiple portions 112A, 112B having respective widths W1, W2 that are less than a width of the isolation region SA in a direction perpendicular to the channel length direction of the transistors MP and MN. As a result, a carrier mobility of the PMOS transistor MP and the NMOS transistor MN may be increased.

Figure 3A:
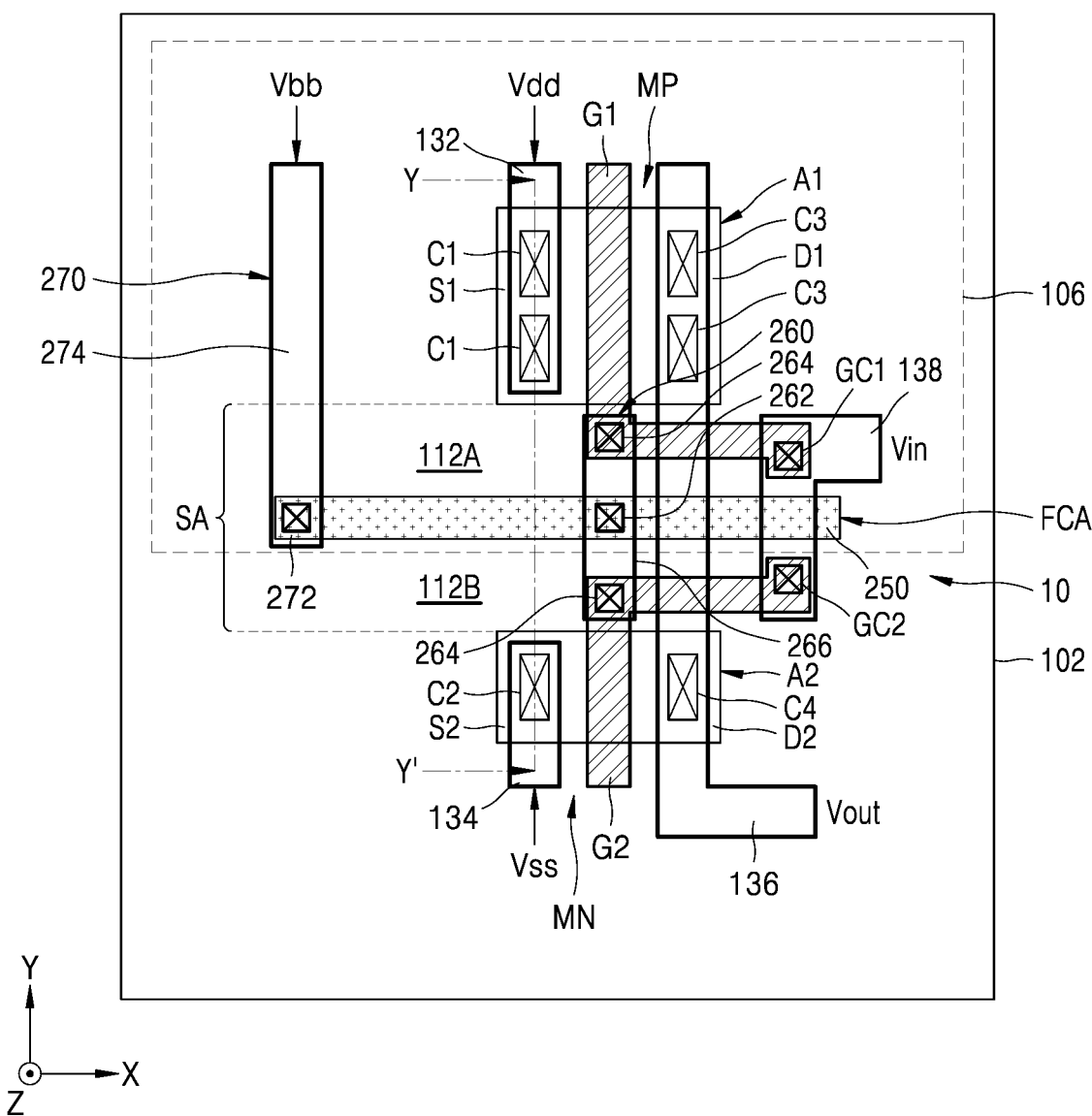
FIG. 3A is a plan view layout of some elements of an integrated circuit device, according to some embodiments of the inventive concepts.
Figure 3B:
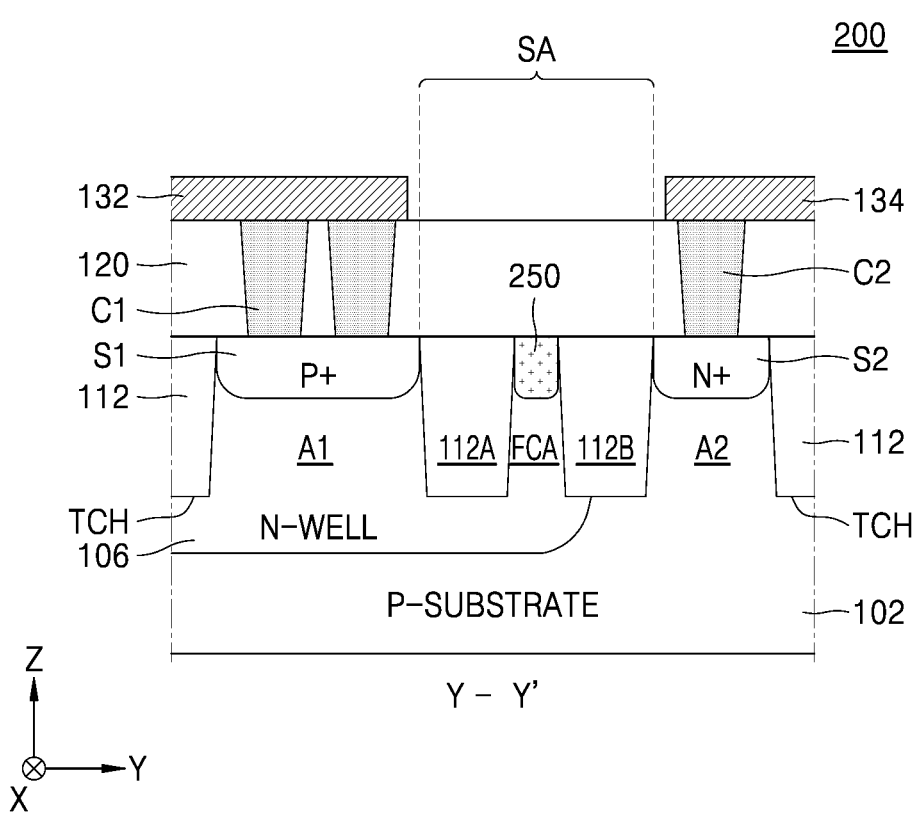
FIG. 3B is a cross-sectional view taken along line Y-Y' in FIG. 3A.

FIG. 3A is a plan view layout of some elements of an integrated circuit device, according to some embodiments of the inventive concepts. FIG. 3B is a cross-sectional view taken along line Y-Y' in FIG. 3A. Like reference numerals in FIGS. 1A through 1C and FIGS. 3A and 3B denote like elements, and redundant descriptions thereof are omitted.

Referring to FIGS. 3A and 3B, an integrated circuit device 200 has a similar or substantially the same configuration as the integrated circuit device 100 described with reference to FIGS. 1A through 1C. However, the integrated circuit device 200 further includes an isolated well 250 in the field cut region FCA. The isolated well 250 may be spaced apart from the first active region A1 with the first isolating portion 112A between the isolated well 250 and the first active region A1 and may be spaced apart from the second active region A2 with the second isolating portion 112B between the isolated well 250 and the second active region A2.

When the field cut region FCA is formed in the n-well 106, the isolated well 250 may include an n+-type doped region and may be formed simultaneously with the second source S2 and the second drain D2. In some embodiments, differently from the field cut region FCA shown in FIGS. 3A and 3B, the field cut region FCA may be formed in a portion of the p-substrate, i.e., the substrate 102, outside the n-well 106. In this case, the isolated well 250 may include a p+-type doped region and may be formed simultaneously with the first source S1 and the first drain D1.

The integrated circuit device 200 may include a first wiring structure 260 electrically connecting at least one of the first gate G1 and the second gate G2 to the isolated well 250. The first wiring structure 260 may include a well contact 262 connected to the isolated well 250, at least one gate contact 264 connected to at least one of the first gate G1 and the second gate G2, and a wiring 266 connecting the well contact 262 to the gate contact 264.

The integrated circuit device 200 may further include a second wiring structure 270 applying a body supply voltage Vbb to the isolated well 250. The second wiring structure 270 may include a well contact 272 connected to the isolated well 250 and a wiring 274 configured to apply the body supply voltage Vbb to the isolated well 250 via the well contact 272. The isolated well 250 may receive the body supply voltage Vbb via the wiring 274 and the well contact 272. When the supply voltage Vdd is applied to a plurality of first gates G1 and a plurality of second gates G2 during the operation of the integrated circuit device 200, the body supply voltage Vbb may be applied to the isolated well 250. At this time, plasma ions undesirably accumulated in each of the first gates G1 and each of the second gates G2 may be discharged to the substrate 102 via the isolated well 250. Accordingly, erroneous operations of transistors occurring due to undesirably accumulated plasma ions may be reduced or prevented in the integrated circuit device 200.

Although FIG. 3A illustrates the case where the first wiring structure 260 is connected to the first gate G1 and the second gate G2 via two gate contacts 264, respectively, the inventive concepts are not limited to the embodiments illustrated in FIG. 3A. For example, the first wiring structure 260 may be connected to only one of the first gate G1 and the second gate G2 via one gate contact 264. Since the first gate G1 and the second gate G2 may be connected to each other via the first gate contact GC1, the second gate contact GC2, and the fourth wiring 138, the first gate G1 and the second gate G2 may be electrically connected to each other even when the first wiring structure 260 is connected to only one of the first gate G1 and the second gate G2.

Figure 4:
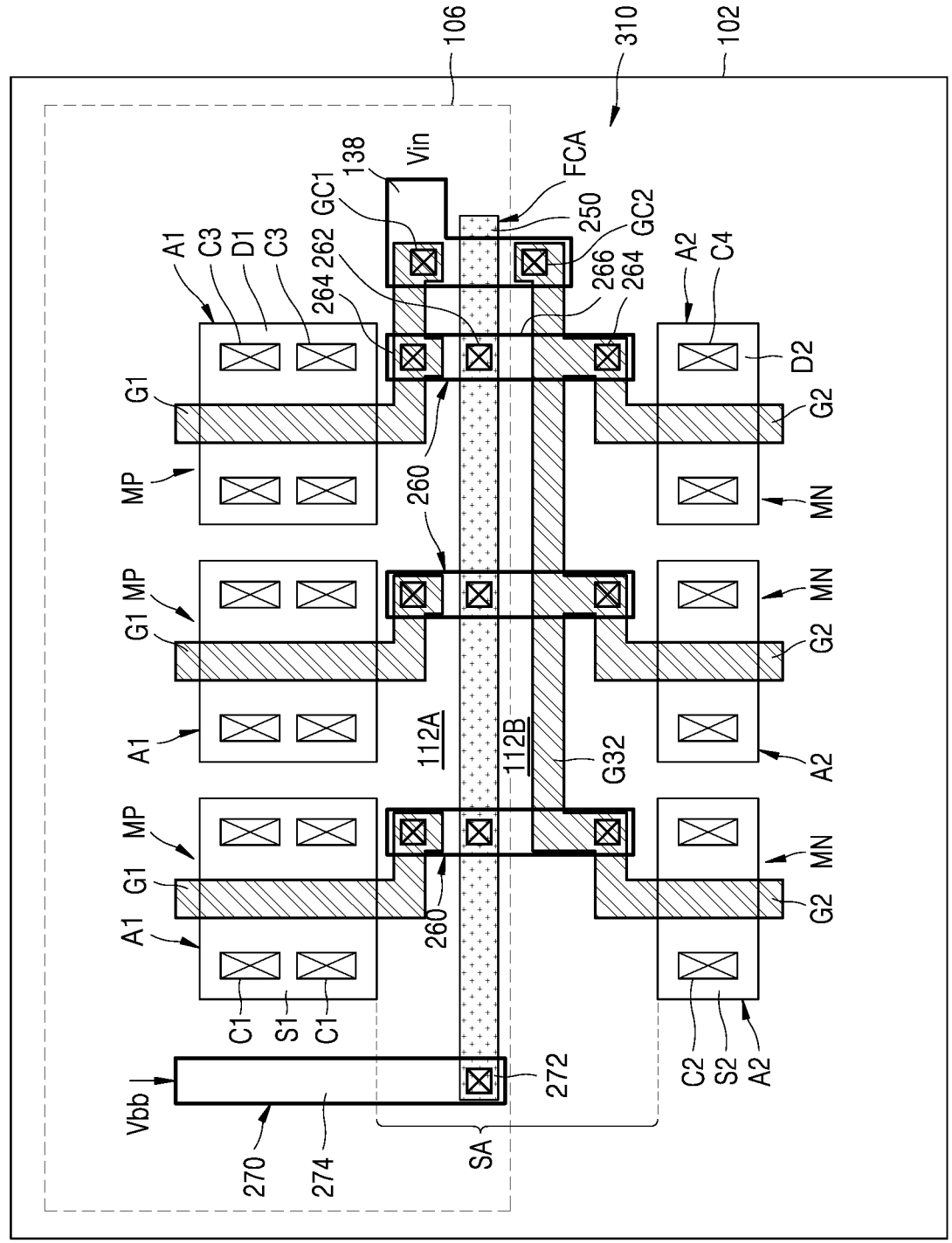
FIG. 4 is a plan view layout of some elements of an integrated circuit device, according to some embodiments of the inventive concepts.

FIG. 4 is a plan view layout of some elements of an integrated circuit device, according to some embodiments of the inventive concepts. Like reference numerals in FIGS. 1A through 4 denote like elements, and redundant descriptions thereof are omitted.

Referring to FIG. 4, an integrated circuit device 300 may include an inverter 310 which includes a plurality of PMOS transistors MP and a plurality of NMOS transistors MN. FIG. 4 illustrates the partial configuration of the inverter 310 included in a multi-fan-out circuit.

Figure 5:
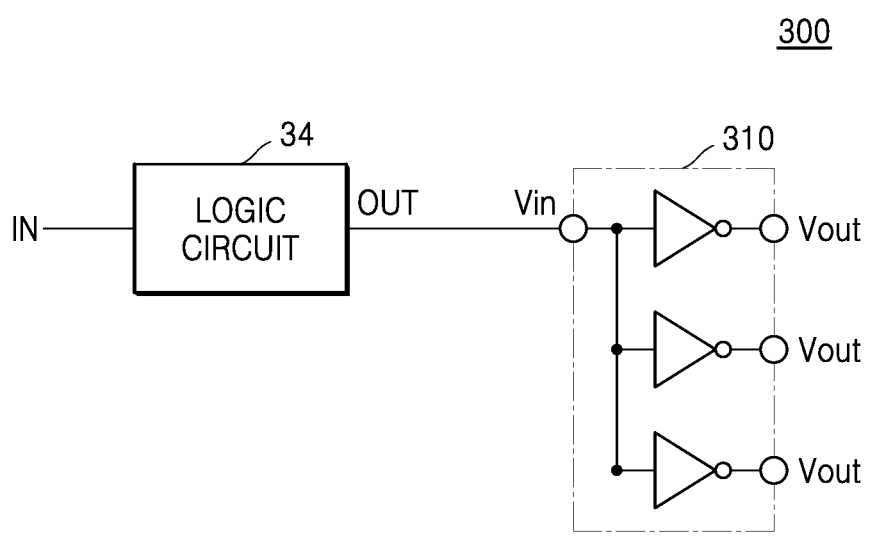
FIG. 5 is an example circuit diagram of an integrated circuit device including an inverter in FIG. 4.

FIG. 5 is an example circuit diagram of the integrated circuit device 300 including the inverter 310 in FIG. 4. Referring to FIG. 5, a logic circuit 34 is connected to an input terminal of the inverter 310 in the integrated circuit device 300. The inverter 310 may include three complementary MOS (CMOS) inverters connected in parallel to an output terminal of the logic circuit 34.

In some embodiments, the logic circuit 34 may include a CMOS inverter. In some embodiments, the logic circuit 34 may include various kinds of logic circuits including a plurality of circuit elements. For example, the logic circuit 34 may include AND, NAND, OR, NOR, exclusive OR (XOR), exclusive NOR (XNOR), adder (ADD), buffer (BUF), delay (DLY), filter, multiplexer (MXT/MXIT), OR/AND/inverter (OAI), AND/OR (AO), AND/OR/inverter (AOI), D flip-flop, reset flip-flop, master-slave flip-flop, latch, or a combination thereof but is not limited thereto.

In the current embodiment, the inverter 310 forming a circuit having a fan-out value of 3 in the integrated circuit device 300 is illustrated, but the inventive concepts are not limited thereto. The fan-out value of a circuit included in the integrated circuit device 300 may be variously changed according to necessity.

Referring back to FIG. 4, the integrated circuit device 300 includes a plurality of first active regions A1 and a plurality of second active regions A2, which are defined in positions spaced apart from one another in the substrate 102. The first active regions A1 may be arranged in the n-well 106, and a plurality of PMOS transistors MP may be respectively formed on the first active regions A1. The second active regions A2 may be arranged in a portion of the p-substrate, i.e., the substrate 102, outside the n-well 106, and a plurality of NMOS transistors MN may be respectively formed on the second active regions A2. The detailed configuration of each of the PMOS transistors MP and each of the NMOS transistors MN is similar to or substantially the same as that of the PMOS transistor MP and the NMOS transistor MN described with reference to FIGS. 1A through 1C.

The first active regions A1 may be arranged in line in or otherwise along a direction (e.g., the X-direction) parallel with a channel length direction of the PMOS transistors MP and the second active regions A2 may be arranged in line in or otherwise along a direction (e.g., the X-direction) parallel with a channel length direction of the NMOS transistors MN. The field cut region FCA may extend along the X-direction in the isolation region SA between the first active regions A1 and the second active regions A2.

The first isolating portion 112A may be between the first active regions A1 and the field cut region FCA, and the second isolating portion 112B may be between the second active regions A2 and the field cut region FCA. The first isolating portion 112A may border or define respective boundaries of the first active regions A1 and the field cut region FCA, and the second isolating portion 112B may border or define respective boundaries of the second active regions A2 and the field cut region FCA. Similarly to the description given with reference to FIGS. 1A through 1C, a Y-direction width of the first isolating portion 112A may be different from or the same as a Y-direction width of the second isolating portion 112B. The Y-direction width of the first isolating portion 112A and the Y-direction width of the second isolating portion 112B may be variously determined by controlling a Y-direction position of the field cut region FCA in the isolation region SA according to electrical characteristics required for the PMOS transistors MP and the NMOS transistors MN.

The isolated well 250 may be formed in the field cut region FCA in the integrated circuit device 300. In some embodiments, the isolated well 250 may be omitted from the integrated circuit device 300.

A plurality of second gates G2 may be connected in common to a common gate line G32. Each of the second gates G2 may receive a voltage or a signal via the fourth wiring 138 and the second gate contact GC2, which are formed on the common gate line G32.

A plurality of first wiring structures 260 may be connected to the common gate line G32. A plurality of first gates G1 forming the PMOS transistors MP may be electrically connected to the isolated well 250 and the common gate line G32 via the first wiring structures 260, respectively. Each of the first wiring structures 260 may include the well contact 262 connected to the isolated well 250, at least one gate contact 264 connected to one of the first gates G1 or the common gate line G32, and the wiring 266 connecting the well contact 262 to the gate contact 264. The first gates G1 and the second gates G2 may be electrically connected to one another via the first wiring structures 260 and the common gate line G32. A first gate G1 in an anterior stage among the first gates G1 may receive a voltage or a signal via the fourth wiring 138 and the first gate contact GC1, which are formed on the first gate G1.

Although not shown in FIG. 4, similarly to the description given with reference to FIGS. 1A through 1C, the first source S1 of each of the PMOS transistors MP may receive the supply voltage Vdd via the first wiring 132 and the first contact C1. The second source S2 of each of the NMOS transistors MN may receive the ground voltage Vss via the second wiring 134 and the second contact C2. The first drain D1 of each of the PMOS transistors MP may be connected to the output terminal OUT via the third wiring 136 and the third contact C3. The second drain D2 of each of the NMOS transistors MN may be connected to the output terminal OUT via the third wiring 136 and the fourth contact C4.

Y-direction tensile stress applied to a channel region of each of the PMOS transistors MP and the NMOS transistors MN may be increased due to the field cut region FCA in the integrated circuit device 300. Accordingly, a carrier mobility of each of the PMOS transistors MP and the NMOS transistors MN may be increased due to the field cut region FCA.

The integrated circuit device 300 may further include the second wiring structure 270 applying the body supply voltage Vbb to the isolated well 250. The detailed configuration of the second wiring structure 270 is similar to or the same as that described above with reference to FIGS. 3A and 3B. The supply voltage Vdd may be applied to the isolated well 250 during the operation of the integrated circuit device 300. At this time, plasma ions undesirably accumulated in the first gates G1 and the second gates G2 may be discharged to the substrate 102 via the isolated well 250.

Figure 6A:
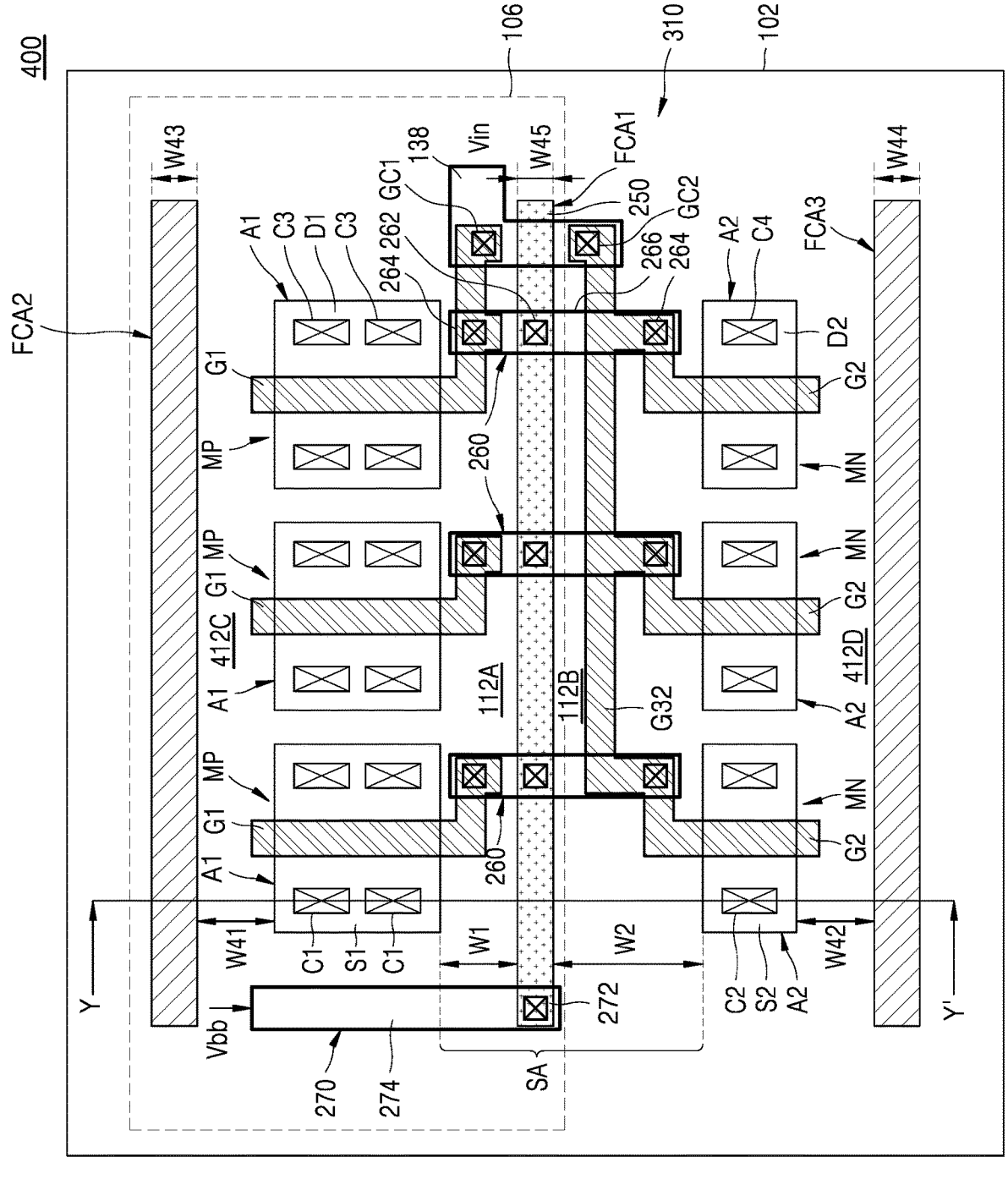
FIG. 6A is a plan view layout of some elements of an integrated circuit device, according to some embodiments of the inventive concepts.
Figure 6B:
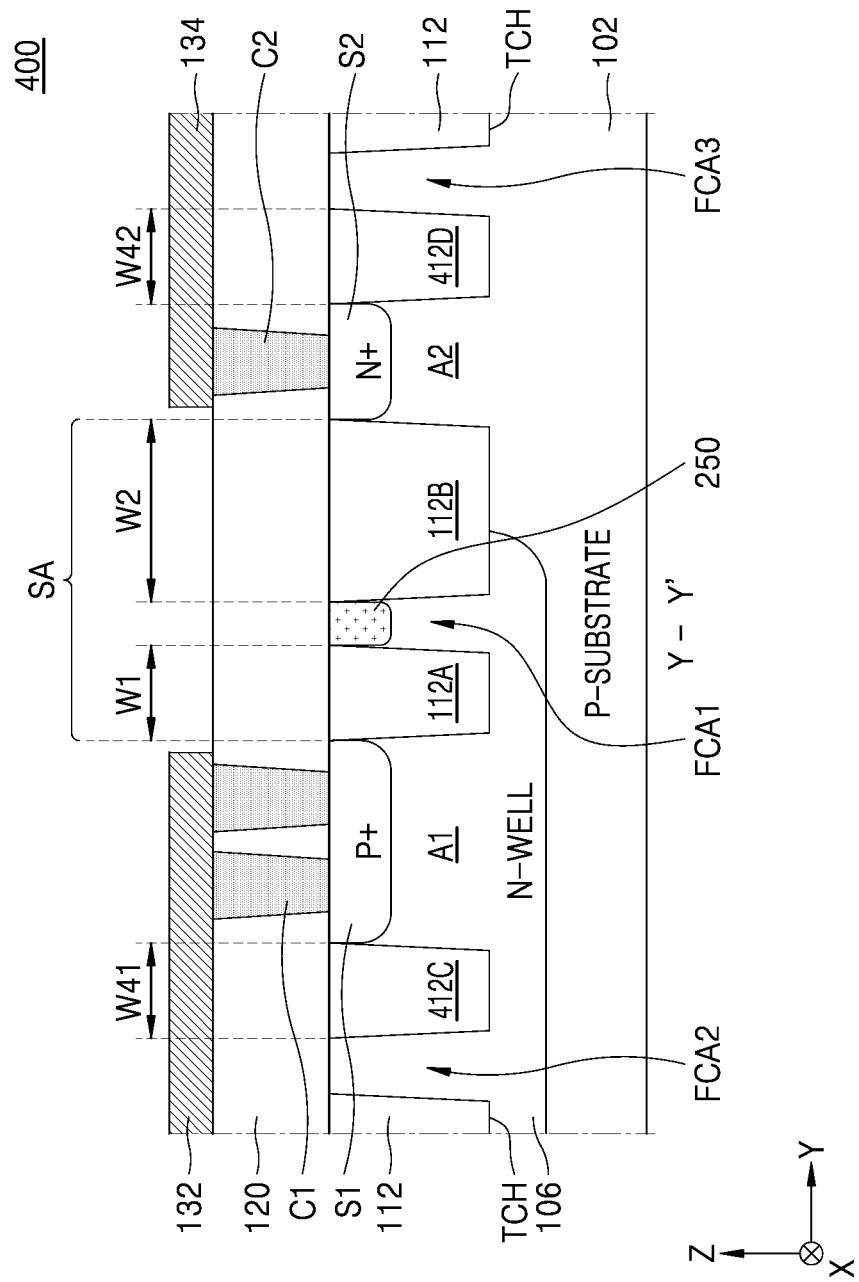
FIG. 6B is a cross-sectional view taken along line Y-Y' in FIG. 6A.

FIG. 6A is a schematic plan view layout of some elements of an integrated circuit device, according to some embodiments of the inventive concepts. FIG. 6B is a cross-sectional view taken along line Y-Y' in FIG. 6A. For simplification of the drawings, the first wiring 132 and the second wiring 134 are not shown in FIG. 6A. Like reference numerals in FIGS. 1A through 6B denote like elements, and redundant descriptions thereof are omitted.

Referring to FIGS. 6A and 6B, an integrated circuit device 400 has a similar or substantially the same configuration as the integrated circuit device 300 described with reference to FIGS. 4 and 5. However, the integrated circuit device 400 may include a first field cut region FCA1 extending along the X-direction in the isolation region SA between the first active regions A1 and the second active regions A2, a second field cut region FCA2 spaced apart from the first field cut region FCA1 with the first active regions A1 between the second field cut region FCA2 and the first field cut region FCA1, and a third field cut region FCA3 spaced apart from the first field cut region FCA1 with the second active regions A2 between the third field cut region FCA3 and the first field cut region FCA1. The second field cut region FCA2 and the third field cut region FCA3 may extend in the X-direction to be parallel with the first field cut region FCA1. The first field cut region FCA1 may have the same configuration as the field cut region FCA described with reference to FIG. 4. The isolated well 250 may be formed in the first field cut region FCA1. The isolated well 250 may be omitted from the integrated circuit device 400.

The second field cut region FCA2 may be arranged in the n-well 106, and the third field cut region FCA3 may be arranged in a portion of the p-substrate, i.e., the substrate 102. Although not shown in FIGS. 6A and 6B, an n+-well or a p+-well may be formed in each of the second field cut region FCA2 and the third field cut region FCA3.

A Y-direction width of each of the second field cut region FCA2 and the third field cut region FCA3 may be defined by the trench TCH formed in the substrate 102. Opposite walls of each of the second field cut region FCA2 and the third field cut region FCA3 in the Y-direction may border or define boundaries of the isolation film 112. The isolation film 112 may include a third isolating portion 412C between the first active regions A1 and the second field cut region FCA2 and a fourth isolating portion 412D between the second active regions A2 and the third field cut region FCA3. The third isolating portion 412C may border or define respective boundaries of the first active regions A1 and the second field cut region FCA2, and the fourth isolating portion 412D may border or define respective boundaries of the second active regions A2 and the third field cut region FCA3. The third isolating portion 412C and the fourth isolating portion 412D may extend along the X-direction.

A distance between the second field cut region FCA2 and the first active regions A1 in the Y-direction may be substantially the same as a Y-direction width W41 of the third isolating portion 412C. The Y-direction width W41 of the third isolating portion 412C may be substantially the same as or different from the Y-direction width W1 of the first isolating portion 112A. For example, the Y-direction width W41 of the third isolating portion 412C may be less or greater than the Y-direction width W1 of the first isolating portion 112A. A distance between the third field cut region FCA3 and the second active regions A2 in the Y-direction may be substantially the same as a Y-direction width W42 of the fourth isolating portion 412D. The Y-direction width W42 of the fourth isolating portion 412D may be substantially the same as or different from the Y-direction width W2 of the second isolating portion 112B. For example, the Y-direction width W42 of the fourth isolating portion 412D may be less or greater than the Y-direction width W2 of the second isolating portion 112B. A ratio of the respective Y-direction widths W1 and W41 of the first isolating portion 112A and the third isolating portion 412C, which are at opposite sides of each of the first active regions A1, and a ratio of the respective Y-direction widths W2 and W42 of the second isolating portion 112B and the fourth isolating portion 412D, which are at opposite sides of each of the second active regions A2, may be determined, taking into account a type and a size or amount of stress to be applied to each of the first active regions A1 and the second active regions A2, occurrence or non-occurrence of defects such as distortion in a semiconductor layer including the first active regions A1 and the second active regions A2 or a lattice mismatch, and so on. When the ratio of the Y-direction widths W1 and W41 and the ratio of the Y-direction widths W2 and W42 are determined appropriately according to the electrical characteristics of the integrated circuit device 400, erroneous operations and degradation of transistors of the inverter 310 may be reduced or prevented and performance may be increased.

In some embodiments, a Y-direction width W43 of the second field cut region FCA2 and a Y-direction width W44 of the third field cut region FCA3 may be substantially equal to or greater than a Y-direction width W45 of the first field cut region FCA1. The Y-direction width W43 of the second field cut region FCA2 may be substantially the same as or different from the Y-direction width W44 of the third field cut region FCA3.

The respective X-direction lengths of the first through third field cut regions FCA1, FCA2, and FCA3 may be substantially the same as or similar to one another. The first active regions A1 may be arranged in a first rectangular region, which is defined by or between the first field cut region FCA1 and the second field cut region FCA2, without going beyond the first rectangular region in the X-direction. The second active regions A2 may be arranged in a second rectangular region, which is defined by or between the first field cut region FCA1 and the third field cut region FCA3, without going beyond the second rectangular region in the X-direction.

In manufacturing the integrated circuit device 400 illustrated in FIGS. 6A and 6B, when the trench TCH defining the first active regions A1 and the second active regions A2 is formed, the first through third field cut regions FCA1, FCA2, and FCA3 may be simultaneously formed. The isolation film 112 filling the trench TCH may be formed around the first through third field cut regions FCA1, FCA2, and FCA3. The isolation film 112 may include the first isolating portion 112A, the second isolating portion 112B, the third isolating portion 412C, and the fourth isolating portion 412D. In some embodiments, the isolated well 250 may be simultaneously formed with a plurality of second sources S2 and a plurality of second drains D2.

Figure 7A:
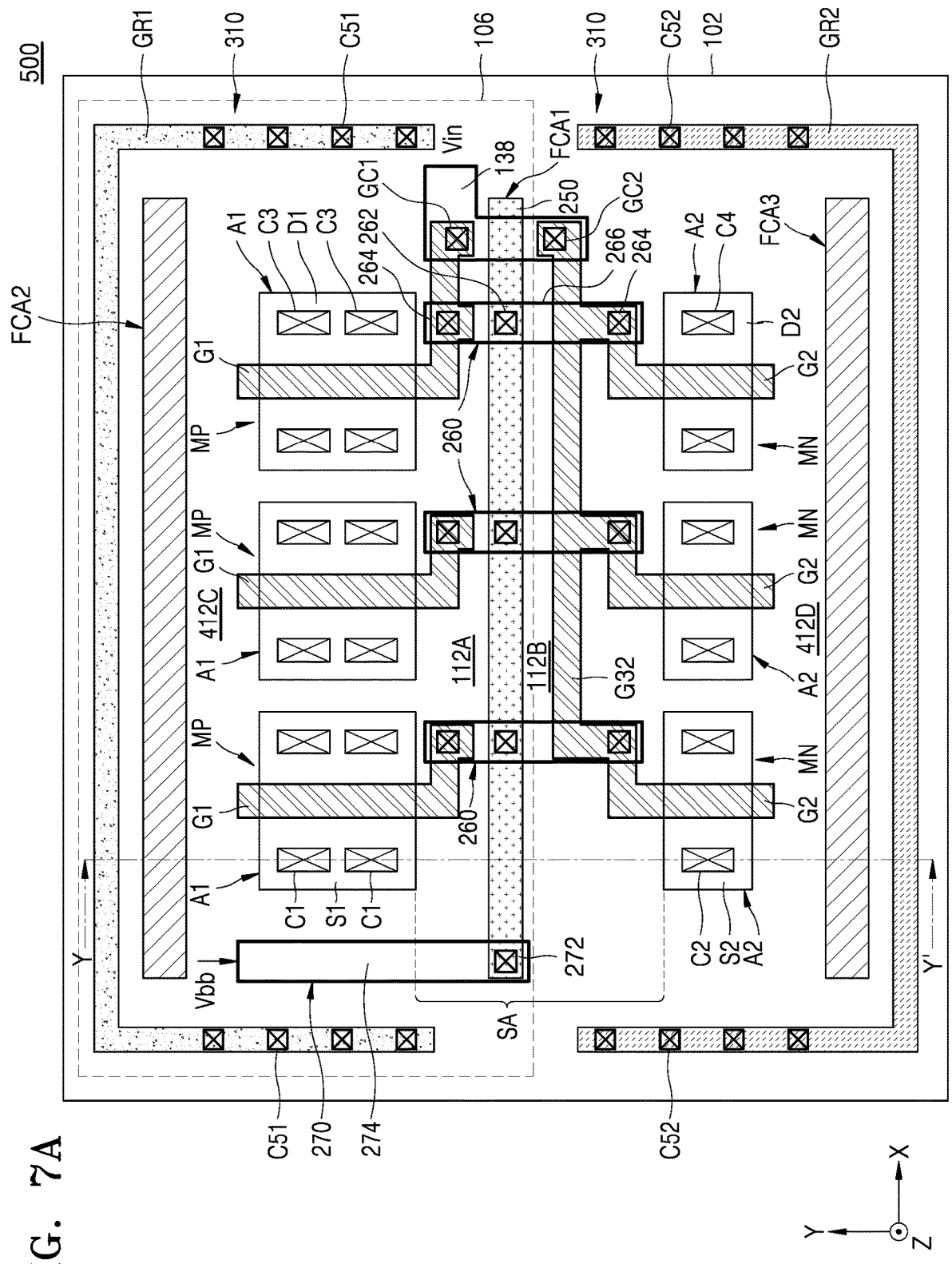
FIG. 7A is a plan view layout of some elements of an integrated circuit device, according to some embodiments of the inventive concepts.
Figure 7B:
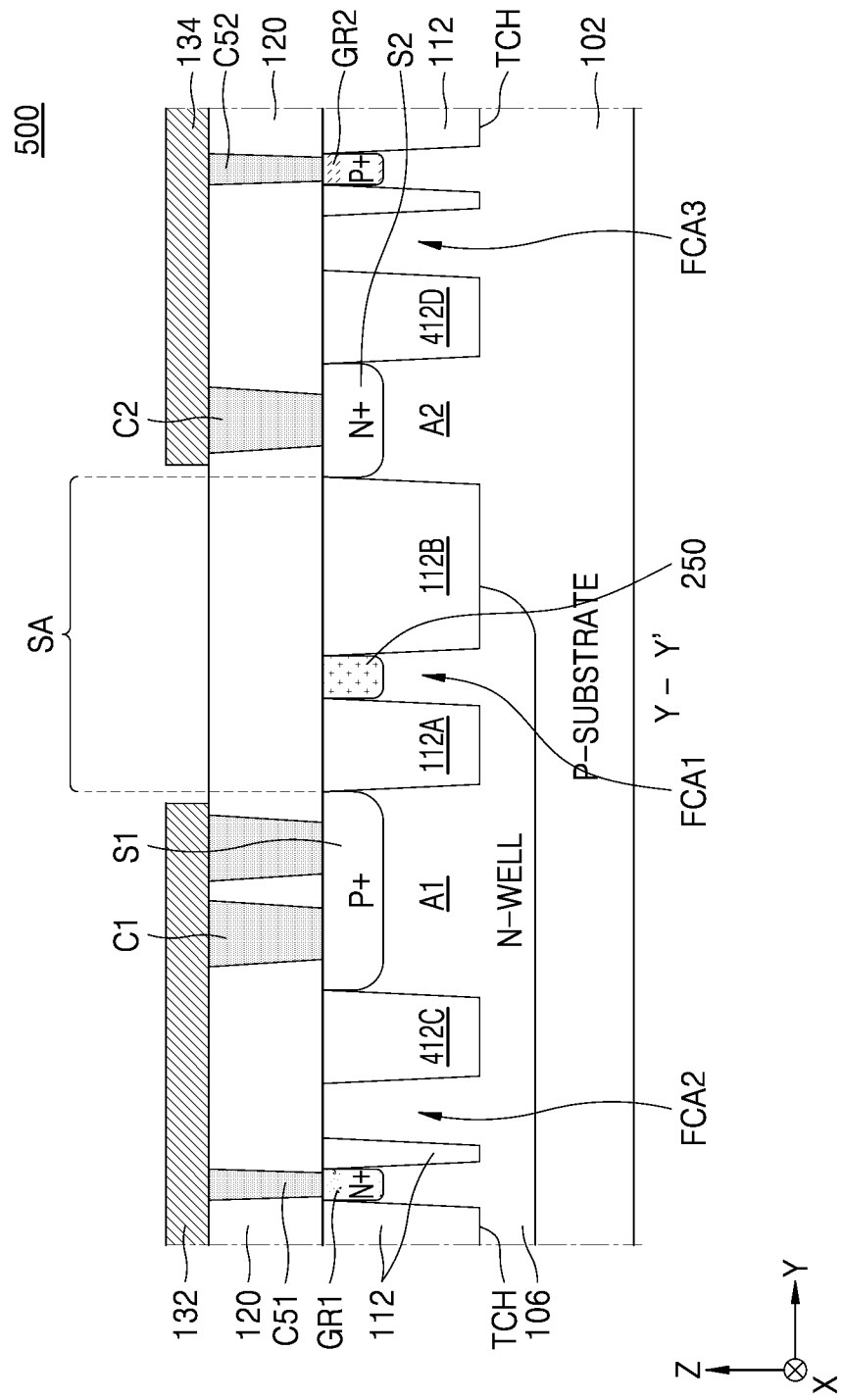
FIG. 7B is a cross-sectional view taken along line Y-Y' in FIG. 7A.

FIG. 7A is a schematic plan view layout of some elements of an integrated circuit device, according to some embodiments of the inventive concepts. FIG. 7B is a cross-sectional view taken along line Y-Y' in FIG. 7A. Like reference numerals in FIGS. 1A through 7B denote like elements, and redundant descriptions thereof are omitted.

Referring to FIGS. 7A and 7B, an integrated circuit device 500 has a similar or substantially the same configuration as the integrated circuit device 400 described with reference to FIGS. 6A and 6B. However, the integrated circuit device 500 further includes a first guard ring GR1 and a second guard ring GR2, which partially surround the inverter 310 at outer sides of the inverter 310.

The first guard ring GR1 and the second guard ring GR2 may be arranged at a periphery of or outside the isolation region SA. The first guard ring GR1 may partially surround the PMOS transistors MP in the n-well 106, and the second guard ring GR2 may partially surround the NMOS transistors MN in a portion of the p-substrate, i.e., the substrate 102. In some embodiments, the first guard ring GR1 may include an n+-type doped region and the second guard ring GR2 may include a p+-type doped region. The first guard ring GR1 may be spaced apart from the first field cut region FCA1 with the PMOS transistors MP between the first guard ring GR1 and the first field cut region FCA1. The second guard ring GR2 may be spaced apart from the first field cut region FCA1 with the NMOS transistors MN between the second guard ring GR2 and the first field cut region FCA1. Each of the first guard ring GR1 and the second guard ring GR2 may be formed in a portion defined by the isolation film 112 in the substrate 102. In some embodiments, the first guard ring GR1 and the second guard ring GR2 may be simultaneously formed with a plurality of first sources S1 and second sources S2 and a plurality of first drains D1 and second drains D2.

A bias voltage may be applied to the first guard ring GR1 via a plurality of contacts C51 and to the second guard ring GR2 via a plurality of contacts C52. Since the bias voltage is applied to the n-well 106 and the substrate 102 via the first guard ring GR1 and the second guard ring GR2, respectively, a bulk voltage may be provided to the PMOS transistors MP and the NMOS transistors MN.

In some embodiments, the first guard ring GR1 may be electrically connected to the first source S1 of each of the PMOS transistors MP via a contact C51, the first wiring 132, and the first contact C1. The supply voltage Vdd may be applied to the first guard ring GR1 via the first wiring 132 and the contact C51. The second guard ring GR2 may be electrically connected to the second source S2 of each of the NMOS transistors MN via a contact C52, the second wiring 134, and the second contact C2. The ground voltage Vss may be applied to the second guard ring GR2 via the second wiring 134 and the contact C52.

The first guard ring GR1 and the second guard ring GR2 may be spaced apart from each other and from the isolated well 250. Each of the first guard ring GR1 and the second guard ring GR2 may have roughly a U-shape or an inverted U-shape in plan view.

A portion of the first guard ring GR1 may extend in parallel with the second field cut region FCA2. The second field cut region FCA2 may be between the PMOS transistors MP and the first guard ring GR1. The PMOS transistors MP may be arranged in a space between the first field cut region FCA1 and the second field cut region FCA2. A portion of the second guard ring GR2 may extend in parallel with the third field cut region FCA3. The third field cut region FCA3 may be between the NMOS transistors MN and the second guard ring GR2. The NMOS transistors MN may be arranged in a space between the first field cut region FCA1 and the third field cut region FCA3.

The integrated circuit device 500 includes the first field cut region FCA1, the second field cut region FCA2, the third field cut region FCA3, the first guard ring GR1, and the second guard ring GR2, and thus, a carrier mobility of the PMOS transistors MP and the NMOS transistors MN may be increased. Accordingly, an ON current increases in the inverter 310, and accordingly, a propagation delay time may be decreased and an operating speed may be increased.

Figure 8:
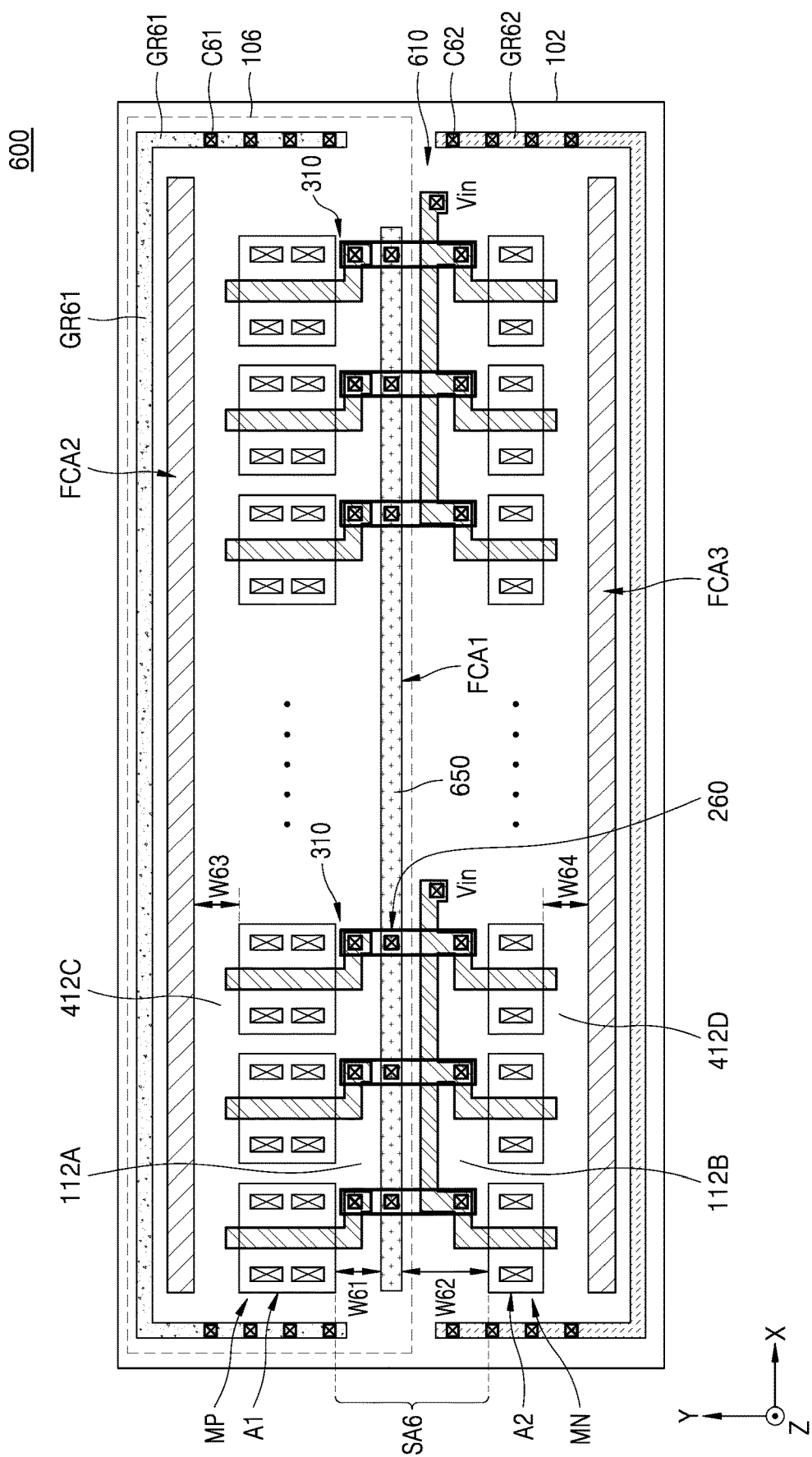
FIGS. 8 through 11 are respectively plan view layouts of integrated circuit devices according to different embodiments of the inventive concepts.

FIG. 8 is a plan view layout of an integrated circuit device according to some embodiments of the inventive concepts. For simplification of the drawings, some elements are not shown in FIG. 8. Like reference numerals in FIGS. 1A through 8 denote like elements, and redundant descriptions thereof are omitted.

Referring to FIG. 8, an integrated circuit device 600 may include an inverter chain 610 including a plurality of inverters 310 connected in series. The configuration of each of the inverters 310 is the same as that described with reference to FIG. 4.

A plurality of PMOS transistors MP included in the inverter chain 610 may be formed in the n-well 106. The first field cut region FCA1 may be arranged between the PMOS transistors MP and a plurality of NMOS transistors MN in the inverter chain 610. The first field cut region FCA1 may be formed in the n-well 106.

The first field cut region FCA1 is spaced apart from a plurality of first active regions A1 with the first isolating portion 112A having a Y-direction width W61 between the first field cut region FCA1 and the first active regions A1 and is spaced apart from a plurality of second active regions A2 with the second isolating portion 112B having a Y-direction width W62 between the first field cut region FCA1 and the second active regions A2. A ratio of the Y-direction width W61 of the first isolating portion 112A and the Y-direction width W62 of the second isolating portion 112B may be appropriately determined, taking into account a type and a size or amount of stress to be applied to the first active regions A1 and the second active regions A2. In some embodiments, the Y-direction width W61 may be substantially the same as or different from the Y-direction width W62.

The integrated circuit device 600 includes an isolation region SA6 between the first active regions A1 and the second active regions A2. The first isolating portion 112A and the second isolating portion 112B, which are separated by the first field cut region FCA1, may be arranged in the isolation region SA6. When the first isolating portion 112A and the second isolating portion 112B, each having a Y-direction width less than a Y-direction width of the isolation region SA6, are arranged in the isolation region SA6, tensile stress applied in a direction (e.g., the Y-direction) perpendicular to the channel of each of the PMOS transistors MP and the NMOS transistors MN may be increased and a carrier mobility of the PMOS transistors MP and the NMOS transistors MN may also be increased.

An isolated well 650 may be formed in the first field cut region FCA1. The isolated well 650 may include an n+-type doped region and, as described above with reference to FIGS. 3A and 3B, may receive the body supply voltage Vbb via the second wiring structure 270. The isolated well 650 may be connected to at least one of a plurality of first gates G1 and a plurality of second gates G2 via a plurality of first wiring structures 260. When the supply voltage Vdd is applied to the first gates G1 and the second gates G2 during the operation of the integrated circuit device 600, the body supply voltage Vbb may be applied to the isolated well 650 and plasma ions undesirably accumulated in the first gates G1 and the second gates G2 may be discharged to the substrate 102 via the isolated well 650. Accordingly, erroneous operations of transistors occurring due to undesirably accumulated plasma ions may be reduced or prevented in the integrated circuit device 600.

The integrated circuit device 600 may further include the second field cut region FCA2 and the third field cut region FCA3. The first active regions A1 may be spaced apart from the second field cut region FCA2 with the third isolating portion 412C between the first active regions A1 and the second field cut region FCA2. The second active regions A2 may be spaced apart from the third field cut region FCA3 with the fourth isolating portion 412D between the second active regions A2 and the third field cut region FCA3. A Y-direction width W63 of the third isolating portion 412C may be substantially the same as or different from the Y-direction width W61 of the first isolating portion 112A. For example, the Y-direction width W63 of the third isolating portion 412C may be less or greater than the Y-direction width W61 of the first isolating portion 112A. A Y-direction width W64 of the fourth isolating portion 412D may be substantially the same as or different from the Y-direction width W62 of the second isolating portion 112B. For example, the Y-direction width W64 of the fourth isolating portion 412D may be less or greater than the Y-direction width W62 of the second isolating portion 112B. When the Y-direction width W63 of the third isolating portion 412C and the Y-direction width W64 of the fourth isolating portion 412D are appropriately determined taking into account a type and a size or amount of stress to be applied to each of the first active regions A1 and the second active regions A2, occurrence or non-occurrence of defects such as distortion in a semiconductor layer including the first active regions A1 and the second active regions A2 or a lattice mismatch, and so on, erroneous operations and degradation of transistors of the inverter chain 610 may be reduced or prevented and performance may be increased. At least one of the second field cut region FCA2 and the third field cut region FCA3 may be omitted from the integrated circuit device 600.

The integrated circuit device 600 may further include a first guard ring GR61 and a second guard ring GR62, which partially surround the inverter chain 610 at outer sides of the inverter chain 610. The first guard ring GR61 may partially surround the PMOS transistors MP of the inverter chain 610 in the n-well 106, and the second guard ring GR62 may partially surround the NMOS transistors MN of the inverter chain 610 in a p-substrate at a periphery of or outside the n-well 106 in the substrate 102. A bias voltage may be applied to the first guard ring GR61 via a plurality of contacts C61 and to the second guard ring GR62 via a plurality of contacts C62. When the bias voltage is applied to the n-well 106 and the substrate 102 via the first guard ring GR61 and the second guard ring GR62, respectively, a bulk voltage may be provided to the PMOS transistors MP and the NMOS transistors MN, which are included in the inverter chain 610. The detailed configuration of the first guard ring GR61, the second guard ring GR62, and the contacts C61 and C62 is similar to or substantially the same as that of the first guard ring GR1, the second guard ring GR2, and the contacts C51 and C52 described with reference to FIGS. 7A and 7B. At least one of the first guard ring GR61 and the second guard ring GR62 may be omitted from the integrated circuit device 600.

Figure 9:
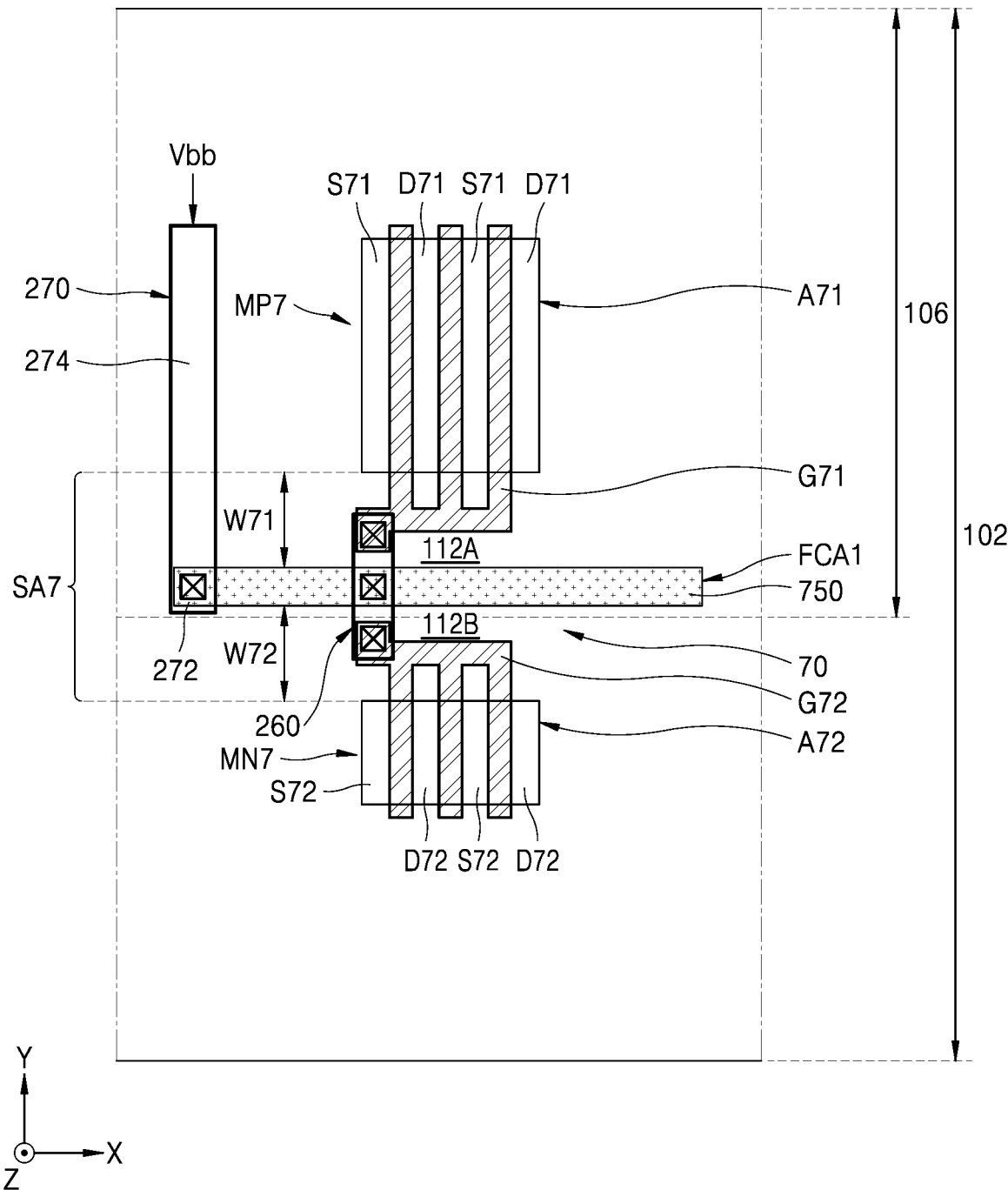

FIG. 9 is a schematic plan view layout of some elements of an integrated circuit device according to some embodiments of the inventive concepts. For simplification of the drawings, some elements are not shown in FIG. 9. Like reference numerals in FIGS. 1A through 9 denote like elements, and redundant descriptions thereof are omitted.

Referring to FIG. 9, an integrated circuit device 700 has a similar or substantially the same configuration as the integrated circuit device 200 described with reference to FIGS. 3A and 3B. However, the integrated circuit device 700 includes an inverter 70, which includes a plurality of transistors including a gate having a multi-finger structure.

The substrate 102 of the integrated circuit device 700 includes a first active region A71 and a second active region A72, which are spaced apart from each other with an isolation region SA7 therebetween. The inverter 70 includes a PMOS transistor MP7 formed on the first active region A71 and an NMOS transistor MN7 formed on the second active region A72. The first active region A71 may be a portion of the n-well 106 in the substrate 102, and the second active region A72 may be a portion of the p-substrate, i.e., the substrate 102.

The first active region A71 may include a first channel region, which overlaps a first gate G71 having a multi-finger structure, and a plurality of first sources S71 and a plurality of first drains D71, of which a pair are respectively arranged at opposite sides of each of the fingers of the first gate G71. The second active region A72 may include a second channel region, which overlaps a second gate G72 having a multi-finger structure, and a plurality of second sources S72 and a plurality of second drains D72, of which a pair are respectively arranged at opposite sides of each of the fingers of the second gate G72. Each of the first sources S71, the first drains D71, the second sources S72, and the second drains D72 may receive a supply voltage or be electrically connected to other transistors via a contact (not shown) connected thereto. Each of the first gate G71 and the second gate G72 may receive a voltage or a signal via a contact (not shown) formed thereon.

The first field cut region FCA1 may extend along the isolation region SA7 between the first active region A71 and the second active region A72 in a direction (e.g., the X-direction) parallel with a channel length direction of each of the PMOS transistor MP7 and the NMOS transistor MN7. The first field cut region FCA1 may have the same configuration as the field cut region FCA described with reference to FIGS. 1A through 1C.

The first isolating portion 112A and the second isolating portion 112B may be respectively arranged at opposite sides of the first field cut region FCA1 in the isolation region SA7 in the Y-direction. The first field cut region FCA1 is spaced apart from the first active region A71 with the first isolating portion 112A having a Y-direction width W71 between the first field cut region FCA1 and the first active region A71 and is spaced apart from the second active region A72 with the second isolating portion 112B having a Y-direction width W72 between the first field cut region FCA1 and the second active region A72. The Y-direction width W71 of the first isolating portion 112A and the Y-direction width W72 of the second isolating portion 112B may be appropriately determined taking into account a type and a size or amount of stress to be applied to each of the first active region A71 and the second active region A72.

When the first field cut region FCA1 is formed in the isolation region SA7, tensile stress applied in a direction perpendicular to a channel of each of the PMOS transistor MP7 and the NMOS transistor MN7 may be increased. As a result, a carrier mobility of the PMOS transistor MP7 and the NMOS transistor MN7 may be increased.

An isolated well 750 may be formed in the first field cut region FCA1. The detailed configuration of the isolated well 750 is the same as or similar to that of the isolated well 250 described with reference to FIGS. 3A and 3B. The isolated well 750 may be omitted from the integrated circuit device 700.

The integrated circuit device 700 may include the first wiring structure 260 for electrically connecting at least one of the first gate G71 and the second gate G72 to the isolated well 750 and the second wiring structure 270 for applying the body supply voltage Vbb to the isolated well 750. The detailed configuration of the first wiring structure 260 and the second wiring structure 270 has been described with reference to FIG. 3A. The body supply voltage Vbb may be applied to the isolated well 750 when the supply voltage Vdd is applied to the first gate G71 and the second gate G72 during the operation of the integrated circuit device 700. At this time, plasma ions undesirably accumulated in the first gate G71 and the second gate G72 may be discharged to the substrate 102 via the isolated well 750.

Figure 10:
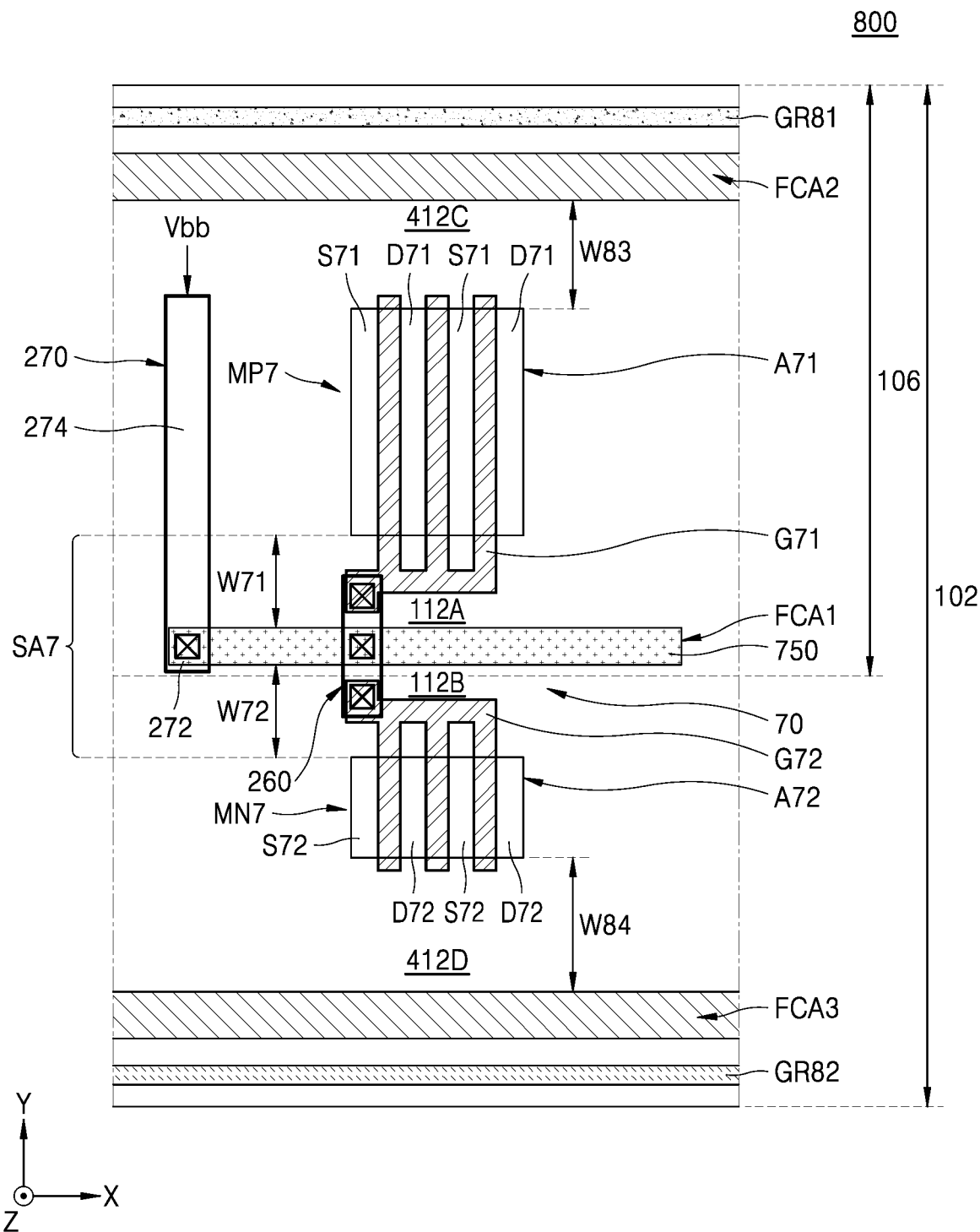

FIG. 10 is a plan view layout of an integrated circuit device according to some embodiments of the inventive concepts. For simplification of the drawings, some elements are not shown in FIG. 10. Like reference numerals in FIGS. 1A through 10 denote like elements, and redundant descriptions thereof are omitted.

Referring to FIG. 10, an integrated circuit device 800 has a similar or substantially the same configuration as the integrated circuit device 700 described with reference to FIG. 9. However, the integrated circuit device 800 further includes the second field cut region FCA2, which is spaced apart from the first field cut region FCA1 with the first active region A71 between the second field cut region FCA2 and the first field cut region FCA1, and the third field cut region FCA3, which is spaced apart from the first field cut region FCA1 with the second active region A72 between the third field cut region FCA3 and the first field cut region FCA1. The second field cut region FCA2 may include a portion of the n-well 106 and the third field cut region FCA3 may include a portion of the p-substrate, i.e., the substrate 102. The first active region A71 may be spaced apart from the second field cut region FCA2 with the third isolating portion 412C having a Y-direction width W83 between the first active region A71 and the second field cut region FCA2. The second active region A72 may be spaced apart from the third field cut region FCA3 with the fourth isolating portion 412D having a Y-direction width W84 between the second active region A72 and the third field cut region FCA3. The Y-direction width W83 of the third isolating portion 412C may be substantially the same as or different from the Y-direction width W71 of the first isolating portion 112A. For example, the Y-direction width W83 of the third isolating portion 412C may be less or greater than the Y-direction width W71 of the first isolating portion 112A. The Y-direction width W84 of the fourth isolating portion 412D may be substantially the same as or different from the Y-direction width W72 of the second isolating portion 112B. For example, the Y-direction width W84 of the fourth isolating portion 412D may be less or greater than the Y-direction width W72 of the second isolating portion 112B. The Y-direction width W83 of the third isolating portion 412C and the Y-direction width W84 of the fourth isolating portion 412D may be appropriately determined, taking into account a type and a size or amount of stress to be applied to each of the first active region A71 and the second active region A72, occurrence or non-occurrence of defects such as distortion in a semiconductor layer including the first active region A71 and the second active region A72 or a lattice mismatch, and so on. When the integrated circuit device 800 includes the first field cut region FCA1, the second field cut region FCA2, and the third field cut region FCA3, erroneous operations and degradation of transistors of the inverter 70 may be reduced or prevented and performance may be increased. In some embodiments, at least one of the second field cut region FCA2 and the third field cut region FCA3 may be omitted from the integrated circuit device 800.

The integrated circuit device 800 may further include a first guard ring GR81 and a second guard ring GR82, which at least partially surround the inverter 70. The first guard ring GR81 may partially surround the PMOS transistor MP7 in the n-well 106 and the second guard ring GR82 may partially surround the NMOS transistor MN7 at the outside of the n-well 106 in the p-substrate, i.e., the substrate 102. The first guard ring GR81 and the second guard ring GR82 may be arranged at a periphery of or outside the isolation region SA7. A bias voltage may be applied to the first guard ring GR81 and the second guard ring GR82. A bulk voltage may be provided to the PMOS transistor MP7 and the NMOS transistor MN7 via the first guard ring GR81 and the second guard ring GR82, respectively. The detailed configuration of the first guard ring GR81 and the second guard ring GR82 is similar to or substantially the same as that of the first guard ring GR1 and the second guard ring GR2 described above with reference to FIGS. 7A and 7B. In some embodiments, at least one of the first guard ring GR81 and the second guard ring GR82 may be omitted from the integrated circuit device 800.

Figure 11:
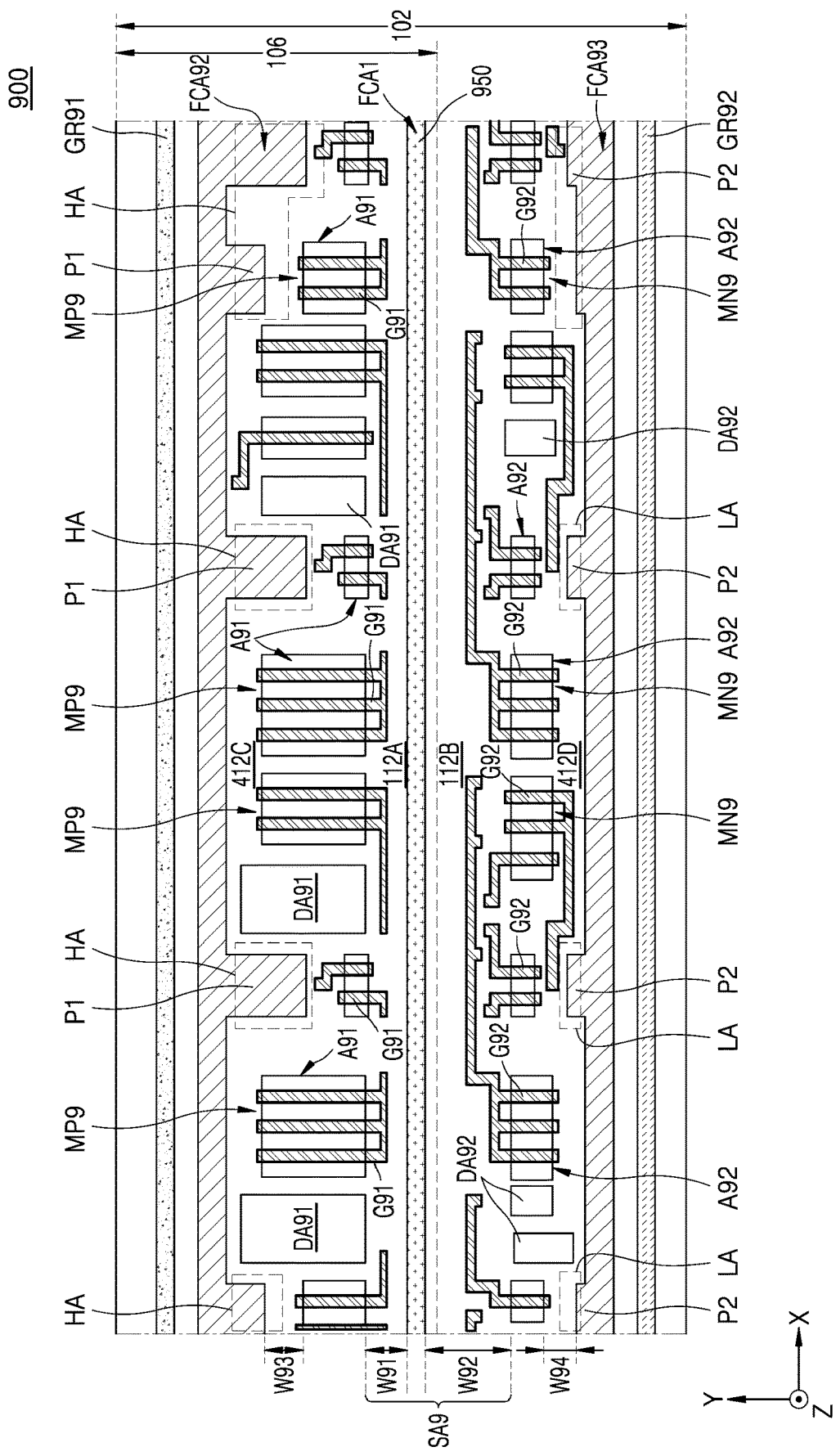

FIG. 11 is a plan view layout of an integrated circuit device according to some embodiments of the inventive concepts. Like reference numerals in FIGS. 1A through 11 denote like elements, and redundant descriptions thereof are omitted.

Referring to FIG. 11, an integrated circuit device 900 includes a plurality of PMOS transistors MP9 and a plurality of NMOS transistors MN9, which form various logic circuits on the substrate 102. The PMOS transistors MP9 may be formed across a plurality of first active regions A91 defined in the n-well 106. The NMOS transistors MN9 may be formed across a plurality of second active regions A92 defined in the p-substrate, i.e., the substrate 102. The PMOS transistors MP9 may include a plurality of first gates G91 and the NMOS transistors MN9 may include a plurality of second gates G92. The first gates G91 and the second gates G92 may have various plan view shapes.

The first field cut region FCA1 may be formed in an isolation region SA9 between the first active regions A91 and the second active regions A92 in the integrated circuit device 900. The first field cut region FCA1 may be formed in the n-well 106.

The first field cut region FCA1 is spaced apart from the first active regions A91 with the first isolating portion 112A having a Y-direction width W91 between the first field cut region FCA1 and the first active regions A91 and is spaced apart from the second active regions A92 with the second isolating portion 112B having a Y-direction width W92 between the first field cut region FCA1 and the second active regions A92. The Y-direction width W91 of the first isolating portion 112A may be substantially the same as or different from the Y-direction width W92 of the second isolating portion 112B.

When the first field cut region FCA1 and the first and second isolating portions 112A and 112B separated by the first field cut region FCA1 are formed in the isolation region SA9, tensile stress applied in a direction (e.g., the Y-direction) perpendicular to a channel of each of the PMOS transistors MP9 and the NMOS transistors MN9 may be increased. As a result, a carrier mobility of the PMOS transistors MP9 and the NMOS transistors MN9 may be increased.

An isolated well 950 may be formed in the first field cut region FCA1. The isolated well 950 may include an n+-type doped region. The isolated well 950 may receive the body supply voltage Vbb via the second wiring structure 270 (see FIG. 10). The isolated well 950 may be electrically connected to at least one of the first gates G91 and the second gates G92. When the supply voltage Vdd is applied to the first gates G91 and the second gates G92 during the operation of the integrated circuit device 900, the body supply voltage Vbb may be applied to the isolated well 950 and plasma ions undesirably accumulated in the first gates G91 and the second gates G92 may be discharged to the substrate 102 via the isolated well 950.

The first active regions A91 and the second active regions A92 may have various Y-direction widths. The sizes of logic circuits implemented by the first active regions A91 and the second active regions A92 may be determined based on a circuit including an active region having a greatest Y-direction width among the first active regions A91 and the second active regions A92. Accordingly, no circuits may be substantially arranged in an upper region HA of a PMOS transistor MP9 formed in a first active region A91 having a relatively less Y-direction width and a lower region LA of an NMOS transistor MN9 formed in a second active region A92 having a relatively less Y-direction width. That is, the upper and lower regions HA and LA may be substantially free of circuits in some embodiments. When regions such as the upper region HA and the lower region LA, in which no circuits are arranged, are filled with an isolation film, the greater the area of the upper region HA and the lower region LA, the greater the imbalance in a stress applied to a channel in each of the first active regions A91 and the second active regions A92 may be. In particular, tensile stress applied in a direction perpendicular to the channel of each of the PMOS transistors MP9 and the NMOS transistors MN9 may be constant.

In embodiments, a second field cut region FCA92 and a third field cut region FCA93 may be used to resolve the stress imbalance, which may occur in a channel region of each of the PMOS transistors MP9 and the NMOS transistors MN9 due to the upper region HA and the lower region LA, and to prevent occurrence of defects such as distortion in a semiconductor layer including the first active regions A91 and the second active regions A92 and/or a lattice mismatch.

A second field cut region FCA92 may be spaced apart from the first field cut region FCA1 with the first active regions A91 between the second field cut region FCA92 and the first field cut region FCA1. A third field cut region FCA93 may be spaced apart from the first field cut region FCA1 with the second active regions A92 between the third field cut region FCA93 and the first field cut region FCA1. The second field cut region FCA92 and the third field cut region FCA93 may extend in parallel with the first field cut region FCA1. The second field cut region FCA92 may include a first protrusion P1, which is arranged in the upper region HA having no circuits arranged therein and protrudes toward the first field cut region FCA1. The third field cut region FCA93 may include a second protrusion P2, which is arranged in the lower region LA having no circuits arranged therein and protrudes toward the first field cut region FCA1.

The first active regions A91 may be spaced apart from the second field cut region FCA92 with the third isolating portion 412C having a Y-direction width W93 between the first active regions A91 and the second field cut region FCA92. The second active regions A92 may be spaced apart from the third field cut region FCA93 with the fourth isolating portion 412D having a Y-direction width W94 between the second active regions A92 and the third field cut region FCA93. The Y-direction width W93 of the third isolating portion 412C may be substantially the same as or different from the Y-direction width W91 of the first isolating portion 112A. For example, the Y-direction width W93 of the third isolating portion 412C may be less or greater than the Y-direction width W91 of the first isolating portion 112A. The Y-direction width W94 of the fourth isolating portion 412D may be substantially the same as or different from the Y-direction width W92 of the second isolating portion 112B. For example, the Y-direction width W94 of the fourth isolating portion 412D may be less or greater than the Y-direction width W92 of the second isolating portion 112B. The Y-direction width W93 of the third isolating portion 412C and the Y-direction width W94 of the fourth isolating portion 412D may be appropriately determined, taking into account a type and a size or amount of stress to be applied to each of the first active regions A91 and the second active regions A92, occurrence or non-occurrence of defects such as distortion in a semiconductor layer including the first active regions A91 and the second active regions A92 and/or a lattice mismatch, and so on. When the integrated circuit device 900 includes the first field cut region FCA1, the second field cut region FCA92, and the third field cut region FCA93, erroneous operations and degradation of transistors of the integrated circuit device 900 may be reduced or prevented and performance may be increased. In some embodiments, at least one of the second field cut region FCA92 and the third field cut region FCA93 may be omitted from the integrated circuit device 900.

The integrated circuit device 900 may further include a plurality of first dummy active regions DA91 and a plurality of second dummy active regions DA92. The first dummy active regions DA91 may be arranged in a region in which no transistors are formed between the first field cut region FCA1 and the second field cut region FCA92. The second dummy active regions DA92 may be arranged in a region in which no transistors are formed between the first field cut region FCA1 and the third field cut region FCA93. The first dummy active regions DA91 may be defined in the n-well 106 by the first isolating portion 112A and the third isolating portion 412C. The second dummy active regions DA92 may be defined in the p-substrate, i.e., the substrate 102, by the second isolating portion 112B and the fourth isolating portion 412D. None of the first gates G91 and the second gates G92 may be arranged in the first dummy active regions DA91 and the second dummy active regions DA92. That is, the dummy active regions DA91 and DA92 may be free of transistor gates. The first dummy active regions DA91 and the second dummy active regions DA92 may be simultaneously formed with the first active regions A91 and the second active regions A92.

For example, when an etching process is performed on the substrate 102 to form trenches (e.g., trenches TCH in FIG. 6B) to define the first active regions A91 and the second active regions A92, a loading effect, in which a difference in an etch amount may occur between a region in which active regions are arranged at a relative high density and a region in which active regions are arranged at a relatively low density, may occur. Due to the loading effect, the trenches may have different depths according to positions thereof in the substrate 102, and accordingly, a stress level may be different among the active regions defined by the trenches or a phenomenon such as an active slip, a crack, or dislocation may occur in the active regions. As a result, an erroneous operation may occur in an integrated circuit device.

The integrated circuit device 900 includes the second field cut region FCA92 including the first protrusion P1 extending to or towards the upper region HA having no circuits arranged therein, the third field cut region FCA93 including the second protrusion P2 extending to or towards the lower region LA having no circuits arranged therein, the first dummy active regions DA91 in the region in which no transistors are formed between the first field cut region FCA1 and the second field cut region FCA92, and the second dummy active regions DA92 in which no transistors are formed between the first field cut region FCA1 and the third field cut region FCA93. Accordingly, a density variation in active regions defined in the substrate 102 may be reduced, and issues of the loading effect described above may be suppressed.

The integrated circuit device 900 may further include a first guard ring GR91 and a second guard ring GR92. The first guard ring GR91 may partially surround each of the PMOS transistors MP9 in the n-well 106 and the second guard ring GR92 may partially surround each of the NMOS transistors MN9 in the p-substrate, i.e., the substrate 102. A bias voltage may be applied to the first guard ring GR91 and the second guard ring GR92. A bulk voltage may be provided to the PMOS transistors MP9 via the first guard ring GR91 and to the NMOS transistors MN9 via the second guard ring GR92. The detailed configuration of the first guard ring GR91 and the second guard ring GR92 is similar to or substantially the same as that of the first guard ring GR1 and the second guard ring GR2 described above with reference to FIGS. 7A and 7B. In some embodiments, at least one of the first guard ring GR91 and the second guard ring GR92 may be omitted from the integrated circuit device 900.

Figure 12:
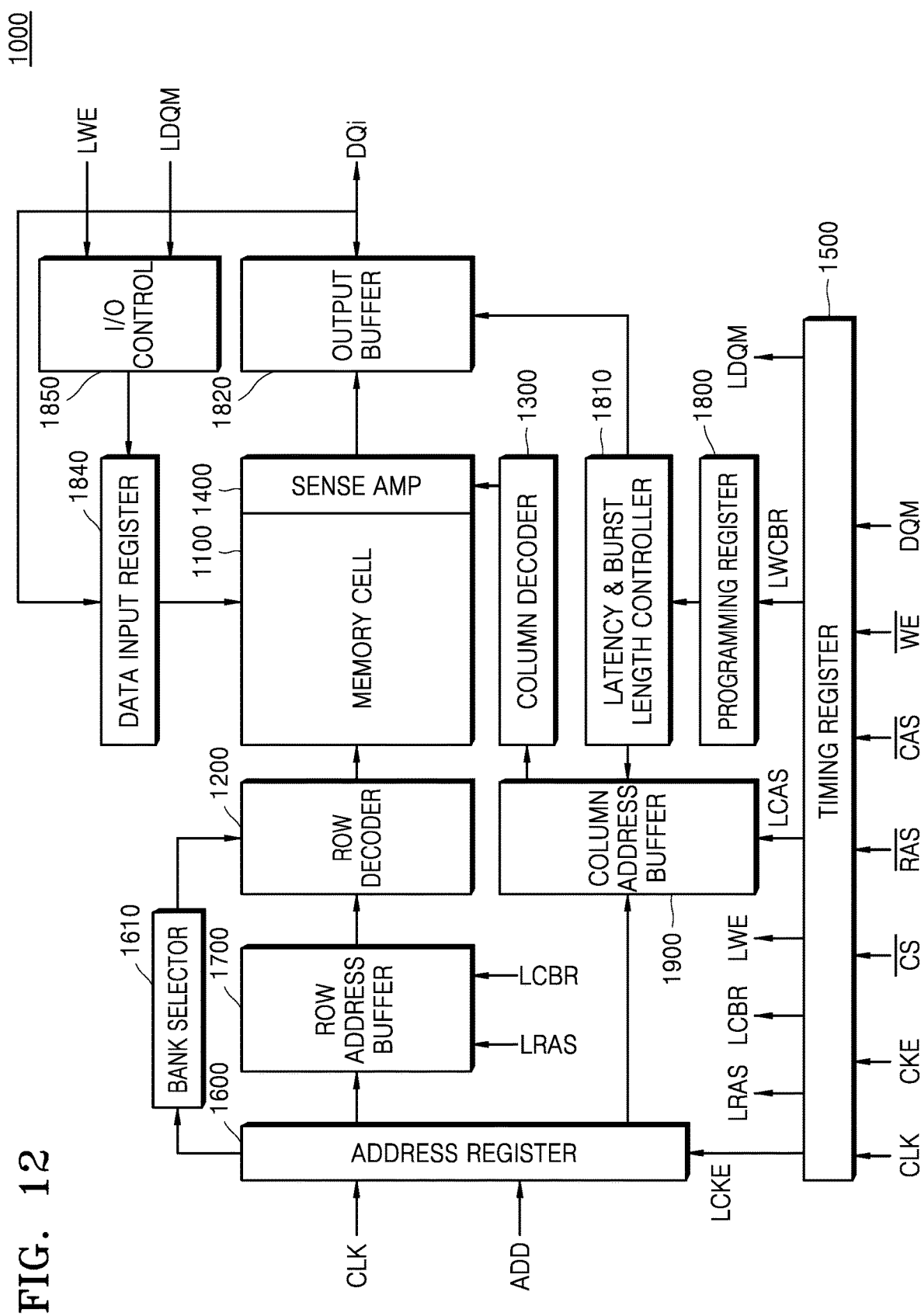
FIG. 12 is a block diagram of an electronic system according to embodiments of the inventive concepts.

FIG. 12 is a block diagram of an electronic system 1000 according to embodiments of the inventive concepts. The electronic system 1000 may include a memory cell array 1100 and peripheral circuits driving the memory cell array 1100. The peripheral circuits may include a row decoder 1200, a column decoder 1300, and a sense amplifier (AMP) 1400. The peripheral circuits may also include various circuit blocks, such as a timing register 1500, an address register 1600, a row address buffer 1700, a programming register 1800, and a column address buffer 1900, to drive the memory cell array 1100. The memory cell array 1100 may include a volatile memory cell, such as a dynamic random access memory (DRAM) cell or a static RAM (SRAM) cell, or a non-volatile memory cell, such as a magnetic RAM (MRAM) cell, a ferroelectric RAM (FeRAM) cell, a phase-change RAM (PRAM) cell, a flash memory cell, or a resistive RAM (RRAM) cell.

The timing register 1500 may externally receive command signals, such as a clock signal CLK, a clock enable signal CKE, a chip selection signal CS, a row address strobe signal RAS, a column address strobe signal CAS, a write enable signal WE, and a data input/output mask signal DQM, and may generate internal command signals, e.g., LCKE, LRAS, LCBR, LWE, LCAS, LWCBR, and LDQM, for controlling the circuit blocks by processing the command signals. Some command signals generated from the timing register 1500 may be stored in the programming register 1800. The command signals stored in the programming register 1800 may be provided to a latency and burst length controller 1810. The latency and burst length controller 1810 may provide a control signal for controlling the latency of data output or a burst length to the column decoder 1300 or an output buffer 1820 through the column address buffer 1900.

The address register 1600 may externally receive an address signal ADD. A row address signal in the address signal ADD may be provided to the row decoder 1200 through the row address buffer 1700 and a column address signal in the address signal ADD may be provided to the column decoder 1300 through the column address buffer 1900. In response to refresh commands LRAS and LCBR, the row address buffer 1700 may further receive a refresh address signal generated from a refresh counter and may provide a row address signal or a refresh address signal to the row decoder 1200. The address register 1600 may provide a bank signal for selecting a bank to a bank selector 1610.

The row decoder 1200 may decode the row address signal or the refresh address signal, which is received from the row address buffer 1700, and may activate a word line of the memory cell array 1100. The column decoder 1300 may decode the column address signal and may select a bit line of the memory cell array 1100.

The sense AMP 1400 may amplify data of a memory cell, which is selected by the row decoder 1200 and the column decoder 1300, and may provide an amplified result to the output buffer 1820. Data to be written to a data cell may be provided to the memory cell array 1100 through a data input register 1840. An I/O controller 1850 may control data transmission through the data input register 1840.

One or more of the integrated circuit devices 100, 200, 300, 400, 500, 600, 700, 800, and 900 according to embodiments described with reference to FIGS. 1A through 11 may be included in at least one of the various peripheral circuits described with reference to FIG. 12.

According to some embodiments, an integrated circuit device includes a field cut region in an isolation region between a first active region for formation of a PMOS transistor and a second active region for formation of an NMOS transistor, so that a carrier mobility of the PMOS transistor and the NMOS transistor may be increased. Accordingly, the performance of a transistor and the operating speed of the integrated circuit device may be increased by a design change, without using complex wiring structures that may cause undesirable parasitic capacitance in a circuit included in the integrated circuit device, and without adding separate processes.

While the inventive concepts have been particularly shown and described with reference to embodiments thereof, it will be understood that various changes in form and details may be made therein without departing from the spirit and scope of the following claims.

What is claimed is:

1. An integrated circuit device comprising:
a substrate comprising a first conductivity type region and a second conductivity type region;
at least one first active region comprising at least one first conductivity type transistor in the second conductivity type region;
at least one second active region comprising at least one second conductivity type transistor in the first conductivity type region, the at least one second active region being spaced apart from the at least one first active region with an isolation region between the at least one second active region and the at least one first active region;
an isolation film in the isolation region;
a first field cut region extending in the isolation region along a first direction that is parallel with a channel length direction of the at least one first conductivity type transistor and the at least one second conductivity type transistor;
a second field cut region spaced apart from the first field cut region with the at least one first active region between the second field cut region and the first field cut region; and
a third field cut region spaced apart from the first field cut region with the at least one second active region between the third field cut region and the first field cut region,
wherein, in a plan view, the second field cut region comprises a first protrusion protruding toward the first field cut region, and
wherein, in the plan view, the third field cut region comprises a second protrusion protruding toward the first field cut region.

2. The integrated circuit device of claim 1, wherein the isolation film comprises:
a first isolating portion between the at least one first active region and the first field cut region and defining respective boundaries of the at least one first active region and the first field cut region, the first isolating portion having a first width that is less than a width of the isolation region; and
a second isolating portion between the at least one second active region and the first field cut region and defining respective boundaries of the at least one second active region and the first field cut region, the second isolating portion having a second width that is less than the width of the isolation region.

3. The integrated circuit device of claim 1, wherein the first field cut region comprises a portion of the substrate that is free of transistors and is in the second conductivity type region, wherein the first field cut region divides the isolation film into multiple portions having respective widths that are less than a width of the isolation region in a direction perpendicular to the channel length direction.

4. The integrated circuit device of claim 1, further comprising an isolated well in the first field cut region and comprising a second conductivity type doped region having a higher doping concentration than the second conductivity type region.

5. The integrated circuit device of claim 1, wherein:
the at least one first conductivity type transistor comprises a first gate and a first channel extending in the channel length direction;
the at least one second conductivity type transistor comprises a second gate and a second channel extending in the channel length direction; and
the first field cut region comprises an isolated well electrically connected to at least one of the first gate and the second gate.

6. The integrated circuit device of claim 1, wherein the second field cut region is in the second conductivity type region, and
the third field cut region is in the first conductivity type region.

7. The integrated circuit device of claim 1, further comprising:
a first dummy active region in a region that is free of transistors between the first field cut region and the second field cut region; and
a second dummy active region in a region that is free of transistors between the first field cut region and the third field cut region.

8. The integrated circuit device of claim 1, further comprising:
a first guard ring at least partially surrounding the at least one first conductivity type transistor and spaced apart from the first field cut region; and
a second guard ring at least partially surrounding the at least one second conductivity type transistor and spaced apart from the first field cut region,
wherein the first guard ring and the second guard ring are at a periphery of or outside the isolation region.

9. The integrated circuit device of claim 8, wherein the first guard ring comprises a second conductivity type doped region in the second conductivity type region, and
the second guard ring comprises a first conductivity type doped region in the first conductivity type region.

10. The integrated circuit device of claim 1, wherein each of the first protrusion and the second protrusion is arranged in a region of the substrate, the region having no circuits arranged therein.

11. An integrated circuit device comprising:
a substrate comprising an n-type region and a p-type region;
a first active region in the n-type region;
a second active region in the p-type region, the second active region being spaced apart from the first active region in a first direction with an isolation region between the second active region and the first active region;
an isolation film in the isolation region;
a first field cut region in the n-type region in the isolation region and extending along a second direction perpendicular to the first direction;
a second field cut region spaced apart from the first field cut region with the first active region between the second field cut region and the first field cut region; and
a third field cut region spaced apart from the first field cut region with the second active region between the third field cut region and the first field cut region,
wherein, in a plan view, the second field cut region comprises a first protrusion protruding toward the first field cut region, and
wherein, in the plan view, the third field cut region comprises a second protrusion protruding toward the first field cut region.

12. The integrated circuit device of claim 11, wherein the first field cut region comprises a portion of the n-type region of the substrate, and wherein the isolation film comprises:
a first isolating portion between the first active region and the first field cut region, the first isolating portion having a first width that is less than a width of the isolation region in the first direction; and
a second isolating portion between the second active region and the first field cut region, the second isolating portion having a second width that is less than the width of the isolation region in the first direction.

13. The integrated circuit device of claim 12, wherein the first and second active regions comprise transistors therein having respective channel lengths extending in the second direction, the transistors comprising a first gate on the first active region, and a second gate on the second active region, the integrated circuit device further comprising:
an isolated well in the first field cut region; and
a wiring structure configured to apply a voltage to the isolated well and to at least one of the first gate or the second gate.

14. The integrated circuit device of claim 13, wherein the isolated well is electrically connected to at least one of the first gate or the second gate.

15. The integrated circuit device of claim 11, further comprising:
a first guard ring spaced apart from the first field cut region with the first active region between the first guard ring and the first field cut region; and
a second guard ring spaced apart from the first field cut region with the second active region between the second guard ring and the first field cut region,
wherein the first guard ring and the second guard ring are at a periphery of or outside the isolation region.

16. The integrated circuit device of claim 15, wherein the first guard ring is in the n-type region and the second guard ring is in the p-type region.

17. The integrated circuit device of claim 11, wherein each of the first protrusion and the second protrusion is arranged in a region of the substrate, the region having no circuits arranged therein.

18. An integrated circuit device comprising:
a substrate comprising an n-type region and a p-type region;
a plurality of first active regions in the n-type region;
a plurality of second active regions in the p-type region, the plurality of second active regions being spaced apart from the plurality of first active regions in a first direction with an isolation region between the plurality of second active regions and the plurality of first active regions;
an isolation film in the isolation region;
a first field cut region in the isolation region, the first field cut region comprising a portion of the substrate and extending across the isolation film in a second direction perpendicular to the first direction;
a second field cut region spaced apart from the first field cut region with the plurality of first active regions between the second field cut region and the first field cut region; and
a third field cut region spaced apart from the first field cut region with the plurality of second active regions between the third field cut region and the first field cut region,
wherein, in a plan view, the second field cut region comprises a first protrusion protruding toward the first field cut region, and
wherein, in the plan view, the third field cut region comprises a second protrusion protruding toward the first field cut region.

19. The integrated circuit device of claim 18, wherein the plurality of first active regions and the plurality of second active regions comprise transistors therein having respective channel lengths extending in the second direction, wherein the portion of the substrate is free of transistors therein, and wherein the isolation film comprises:
a first isolating portion between the plurality of first active regions and the first field cut region; and
a second isolating portion between the plurality of second active regions and the first field cut region,
wherein the first isolating portion and the second isolating portion have different widths from each other in the first direction.

20. The integrated circuit device of claim 18, further comprising:
a first guard ring spaced apart from the first field cut region with the plurality of first active regions between the first guard ring and the first field cut region; and a second guard ring spaced apart from the first field cut region with the plurality of second active regions between the second guard ring and the first field cut region, wherein the first guard ring and the second guard ring are at a periphery of or outside the isolation region.

* * * * *